US012738219B2

(12) United States Patent
Park et al.

(10) Patent No.: US 12,738,219 B2
(45) Date of Patent: Sep. 15, 2026

(54) DISPLAY DEVICE

(71) Applicant: LG Display Co., Ltd., Seoul (KR)

(72) Inventors: JeHyung Park, Daegu (KR); Hyewon Byeon, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/968,943

(22) Filed: Dec. 4, 2024

(65) Prior Publication Data

US 2025/0201192 A1 Jun. 19, 2025

(30) Foreign Application Priority Data

Dec. 13, 2023 (KR) ........................ 10-2023-0181086

(51) Int. Cl.

*G09G 3/3233* (2016.01)
*H10H 29/32* (2025.01)
*H10K 59/121* (2023.01)
*H10K 59/131* (2023.01)

(52) U.S. Cl.

CPC ........... *G09G 3/3233* (2013.01); *H10H 29/32* (2025.01); *H10K 59/1213* (2023.02); *G09G 2300/0426* (2013.01); *G09G 2300/0809* (2013.01); *G09G 2300/0842* (2013.01); *G09G 2300/0861* (2013.01); *G09G 2310/0286* (2013.01); *G09G 2320/0233* (2013.01); *G09G 2330/021* (2013.01); *H10K 59/131* (2023.02)

(58) Field of Classification Search

CPC .. G09F 9/33; G09F 9/335; G09G 3/32; G09G 3/3233; G09G 3/3258; G09G 2300/0426; G09G 2300/0809; G09G 2300/0842; G09G 2300/0861; G09G 2310/0264; G09G 2310/0286; G09G 2320/0233; G09G 2330/021; H10H 29/32; H10K 59/1213; H10K 59/124; H10K 59/131; H10K 77/10

See application file for complete search history.

(56) References Cited

U.S. PATENT DOCUMENTS 10,510,302 B2 * 12/2019 Yoo .................... H10K 59/1216
11,373,599 B1 * 6/2022 Chen .................... H10K 59/131
11,562,700 B2 1/2023 Lee et al.

(Continued)

FOREIGN PATENT DOCUMENTS

KR 10-2022-0074394 A 6/2022

OTHER PUBLICATIONS

Intellectual Property Office of the United Kingdom, Combined Search and Examination Report, United Kingdom Patent Application No. GB2415329.8, Apr. 15, 2025, seven pages.

*Primary Examiner* — Julie Anne Watko
(74) *Attorney, Agent, or Firm* — Fenwick & West LLP

(57) ABSTRACT

A display device includes a plurality of subpixels, a plurality of subpixel circuits in the plurality of subpixels, each of the plurality of subpixel circuits comprising a driving transistor, and a plurality of constant voltage lines connected to the plurality of subpixel circuits. A gate electrode of the driving transistor overlaps at least one of the plurality of constant voltage lines. The plurality of constant voltage lines comprise a first constant voltage line to which a first constant voltage is applied, and a second constant voltage line to which a second constant voltage is applied. The gate electrode of the driving transistor overlaps the first constant voltage line and the second constant voltage line.

14 Claims, 19 Drawing Sheets

(56) References Cited

U.S. PATENT DOCUMENTS

| | | | | |
|---|---|---|---|---|
| 11,721,287 | B2 | 8/2023 | Zhang et al. | |
| 2013/0187554 | A1* | 7/2013 | Ono | G09G 3/3233 315/172 |
| 2021/0028261 | A1* | 1/2021 | Lee | H10K 59/126 |
| 2022/0172683 | A1 | 6/2022 | Lee et al. | |
| 2023/0337465 | A1 | 10/2023 | Huang et al. | |
| 2024/0107812 | A1* | 3/2024 | Kim | G09G 3/3233 |
| 2024/0306463 | A1* | 9/2024 | Sung | H10K 59/40 |
| 2024/0324294 | A1* | 9/2024 | Yeo | H10K 59/131 |
| 2025/0140184 | A1* | 5/2025 | Fan | H10D 86/00 |

* cited by examiner

DISPLAY DEVICE

CROSS-REFERENCE TO RELATED APPLICATION

This application claims the priority of Republic of Korea Patent Application No. 10-2023-0181086 filed on Dec. 13, 2023, which is hereby incorporated by reference in its entirety.

BACKGROUND

Field

The present specification relates to a display device, and more particularly, to a display device with improved display quality.

Description of the Related Art

With the advancement of technologies in the modern society, display devices are being used in various ways to provide information to users. The display devices may be included in electronic display boards, which simply transfer visual information in one direction, and also included in various high-technology electronic devices that identify user inputs and provide information in response to the identified inputs.

Representative display devices include a liquid crystal display (LCD) device, a field emission display (FED) device, an electrowetting display (EWD) device, an organic light-emitting display (OLED) device, and the like.

Among the display devices, an organic light-emitting display device refers to a display device that autonomously emits light. Unlike a liquid crystal display apparatus, the organic light-emitting display device does not require a separate light source and thus may be manufactured as a lightweight, thin display device. In addition, the organic light-emitting display device is advantageous in terms of power consumption because the electroluminescent display device operates at a low voltage. Further, the organic light-emitting display device is expected to be adopted in various fields because the organic light-emitting display device is also excellent in implementation of colors, response speeds, viewing angles, and contrast ratios (CRs).

SUMMARY

An object to be achieved by the present specification is to provide a display device capable of optimizing a manufacturing process.

Another object to be achieved by the present specification is to provide a display device capable of improving image quality.

Objects of the present disclosure are not limited to the above-mentioned objects, and other objects, which are not mentioned above, can be clearly understood by those skilled in the art from the following descriptions.

A display device according to an exemplary embodiment of the present disclosure includes a plurality of subpixels, a plurality of subpixel circuits disposed in the plurality of subpixels and comprising a driving transistor and a plurality of constant voltage lines connected to the plurality of subpixel circuits, wherein a gate electrode of the driving transistor overlaps at least one of the plurality of constant voltage lines.

A display device according to another exemplary embodiment of the present disclosure includes a substrate on which a plurality of subpixels is defined, driving transistors respectively disposed in the plurality of subpixels on the substrate, first constant voltage line which is connected to the plurality of subpixels and to which a first constant voltage is applied and a second constant voltage line which is connected to the plurality of subpixels and to which a second constant voltage is applied, wherein a gate electrode of the driving transistor overlaps at least one of the first constant voltage line and the second constant voltage line.

Other detailed matters of the exemplary embodiments are included in the detailed description and the drawings.

According to the present specification, it is possible to optimize a manufacturing process by excluding a mask process by excluding a metal layer.

According to the present specification, it is possible to improve the display quality of the display device by minimizing or at least reducing a threshold voltage compensation error rate and a luminance deviation in a voltage compensation drive method.

According to the present specification, it is possible to increase a capacitor capacity by using the conductive pattern connected to the constant voltage line.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
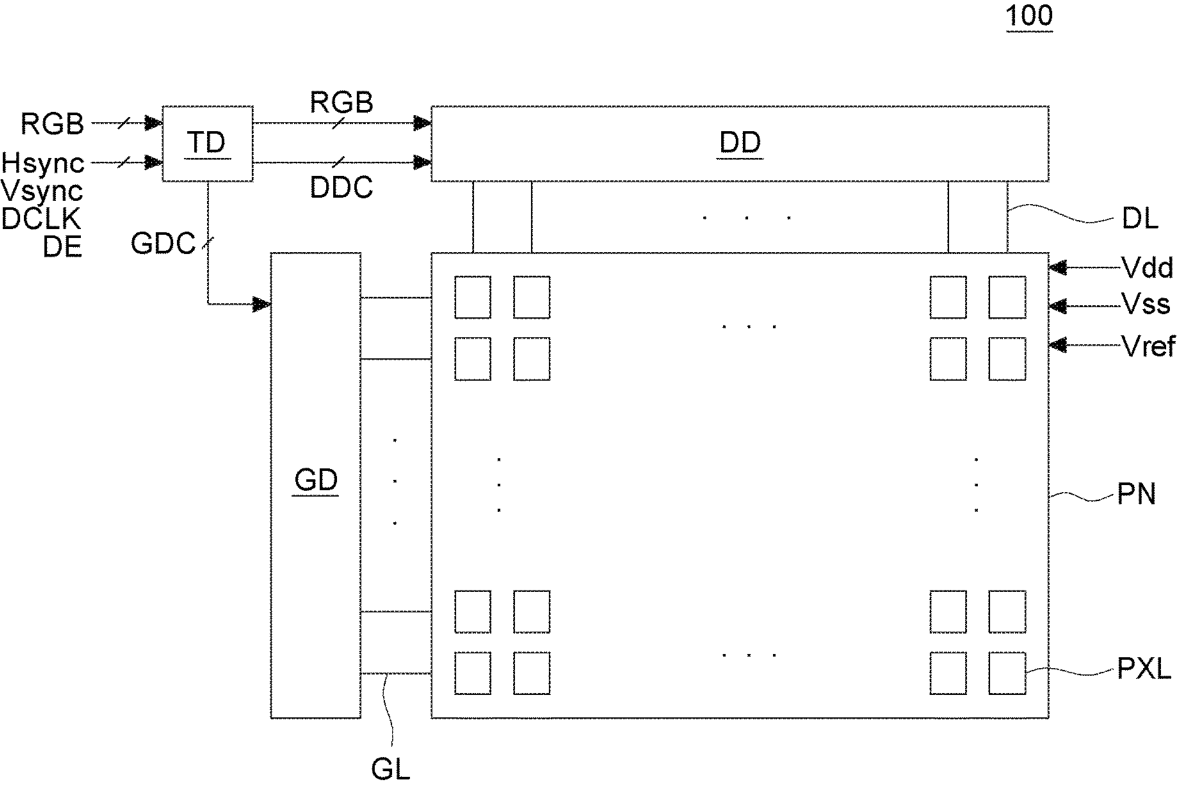
FIG. 1 is a functional block diagram of a display device according to an embodiment of the present specification.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

In describing components of the exemplary embodiment of the present disclosure, terminologies such as first, second, A, B, (a), (b), and the like may be used. These terminologies are used to distinguish a component from the other component, but a nature, an order, or the number of the components is not limited by the terminology. When a component is "linked", "coupled", or "connected" to another component, the component may be directly linked or connected to the other component. However, unless specifically stated otherwise, it should be understood that a third component may be interposed between the components which may be indirectly linked or connected.

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

The following embodiments will be described focusing on the organic light emitting display device. However, embodiments of the present specification are not limited to organic light emitting display devices and can be applied to various electroluminescent displays. For example, the electroluminescent display apparatus may use an organic light emitting diode (OLED) display apparatus, a quantum dot light emitting diode display apparatus, or an inorganic light emitting diode display apparatus.

Hereinafter, exemplary embodiments of the present disclosure will be described in detail with reference to accompanying drawings.

Figure 2:
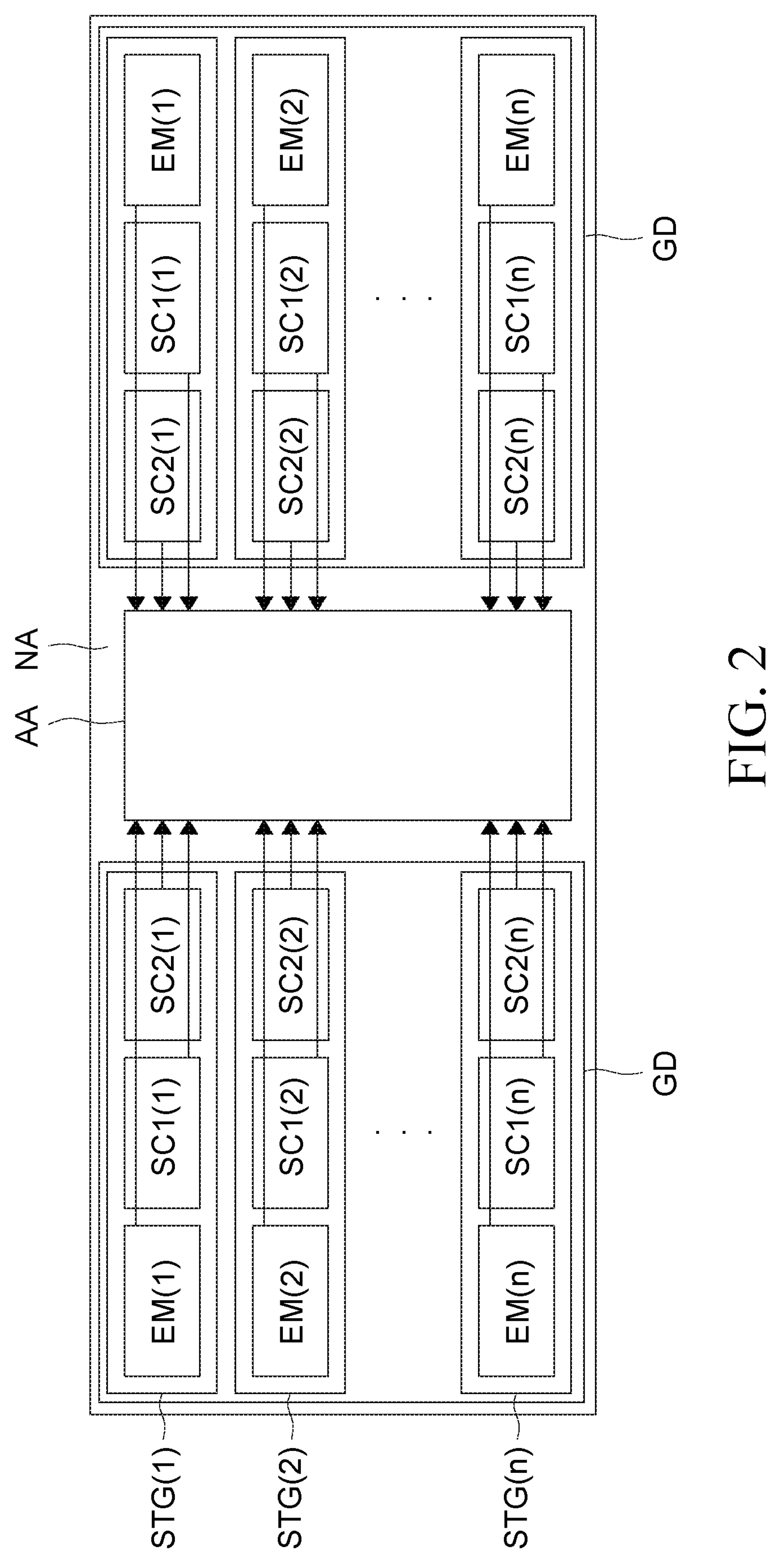
FIG. 2 is a functional block diagram of a gate drive circuit of the display device according to an embodiment of the present specification.

FIG. 1 is a functional block diagram of a display device according to an embodiment of the present specification. FIG. 2 is a functional block diagram of a gate drive circuit of the display device according to the embodiment of the present specification.

An electroluminescent display device may be applied as a display device 100 according to an embodiment of the present specification. An organic light-emitting diode display device, a quantum-dot light-emitting diode display device, or an inorganic light-emitting diode display device may be used as the electroluminescent display device.

With reference to FIG. 1, the display device 100 may include a display panel PN including subpixels PXL, a data drive circuit DD, a gate drive circuit GD, and a timing controller TC.

The display panel PN may create an image to be provided to the user. For example, the display panel PN may create and display an image, which is to be provided to the user, by means of pixels in which the plurality of subpixels PXL is disposed.

The data drive circuit DD, the gate drive circuit GD, and the timing controller TC may provide signals for operating the subpixels PXL through signal lines. For example, the signal lines may include data lines DL and gate lines GL.

The data lines DL may include a plurality of lines arranged in a column direction and connected to the subpixels PXL disposed in one column direction. The gate lines GL may include a plurality of lines arranged in a row direction and connected to the subpixels PXL disposed in one row direction.

In some instances, the display device 100 may further include a power source unit. In this case, a power voltage for operating the subpixel PXL may be provided through a power line that connects the power source unit and the display panel PN. For example, the power source unit may provide a high-potential voltage Vdd, a low-potential voltage Vss, and a reference voltage Vref to the subpixel PXL. The high-potential voltage Vdd, the low-potential voltage Vss, and the reference voltage Vref may each be a constant voltage at a predetermined level. In addition, the power source unit may provide power voltages to the data drive circuit DD and the gate drive circuit GD. The data drive circuit DD and the gate drive circuit GD may operate on the basis of the power voltage provided from the power source unit.

For example, the data drive circuit DD may apply data voltages to the subpixels PXL through the data lines DL, the gate drive circuit GD may apply gate signals to the subpixels PXL through the gate lines GL, and the power source unit may supply power voltages to the subpixels PXL through power lines.

The timing controller TC may control the data drive circuit DD and the gate drive circuit GD. For example, the timing controller realigns digital video data RGB, which are inputted from the outside, to fit the resolution of the display panel PN and supply the digital video data RGB to the data drive circuit DD. In addition, the timing controller TC may generate a data control signal DDC for controlling an operation timing of the data drive circuit DD on the basis of timing signals, such as a vertical synchronizing signal Vsync, a horizontal synchronizing signal Hsync, a dot clock signal DCLK, and a data enable signal DE and generate a gate control signal GDC for controlling an operation timing of the gate drive circuit GD.

The data drive circuit DD may convert digital video data, which are inputted from the timing controller TC, into analog data voltage on the basis of the data control signal DDC and supply the analog data voltage to the plurality of data lines DL.

The gate drive circuit GD may generate scan signals Scan1 and Scan2 and a light emission signal (or a light emission control signal) EM on the basis of the gate control signal GDC and supply the scan signals Scan1 and Scan2 and the light emission signal (or the light emission control signal) EM to the plurality of gate lines GL.

According to the embodiment, the gate drive circuit GD may be disposed on the display panel PN in a gate-driver-in-panel (GIP) manner. For example, the gate drive circuit GD may be divided into a plurality of gate drivers and respectively disposed on at least two side surfaces of the display panel PN.

The display panel PN may include a display area AA, and a non-display area NA configured to surround the display area AA.

The display area AA of the display panel PN may include the plurality of subpixels PXL disposed in the row direction and the column direction. The subpixel PXL may be disposed in areas in which the plurality of data lines DL and the plurality of gate lines GL intersect one another.

One pixel may include the plurality of subpixels that emit light beams with different colors. For example, the pixel may implement blue, red, and green by using three subpixels PXL. However, the present specification is not limited thereto. In some instances, the pixel may further include the subpixel PXL for further implementing a particular color (e.g., white).

In the pixel PX, the area for implementing blue may be referred to as a blue subpixel, an area for implementing red may be referred to as a red subpixel, and an area for implementing green may be referred to as a green subpixel.

The non-display area NA may be disposed along a periphery of the display area AA. Various constituent elements for operating the plurality of subpixels PXL may be disposed in the non-display area NA. For example, at least a part of the gate drive circuit GD may be disposed in the non-display area NA. The non-display area NA may be referred to as a bezel area.

With reference to FIG. 2, the gate drive circuit GD includes a plurality of stages STG1 to STGn provided at two opposite sides of the display area AA and symmetrically disposed in the non-display area NA.

The plurality of stages STG1 to STGn respectively include first scan drive parts SC1(1) to SC1(*n*), second scan drive parts SC2(1) to SC2 (*n*), and light emission drive parts EM1(1) to EM1(*n*). The plurality of stages STG1 to STGn may be disposed in the order of second scan drive parts SC2(1) to SC2 (*n*), first scan drive parts SC1(1) to SC1(*n*), and light emission drive parts EM1(1) to EM1(*n*) from a position adjacent to the display area AA. However, the present specification is not limited thereto. The plurality of stages may be changed in accordance with design.

The first scan drive parts SC1(1) to SC1(*n*) may output a first scan signal Scan1 in response to the gate control signal GDC from the timing controller TC.

The second scan drive parts SC2(1) to SC2 (*n*) may output a second scan signal Scan2 in response to the gate control signal GDC from the timing controller TC.

Figure 3:
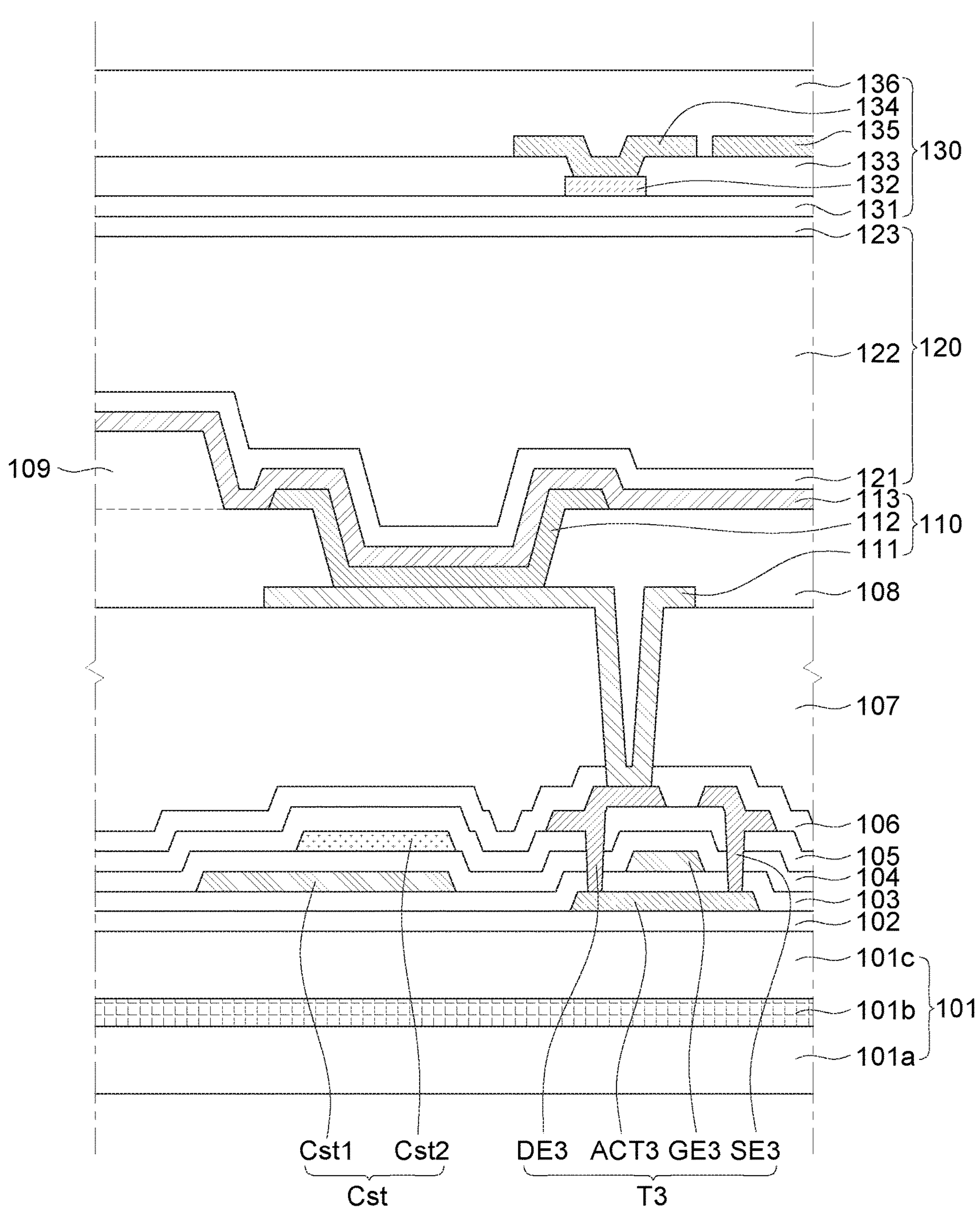
FIG. 3 is a cross-sectional view illustrating a display area of the display device according to an embodiment of the present specification.
Figure 4:
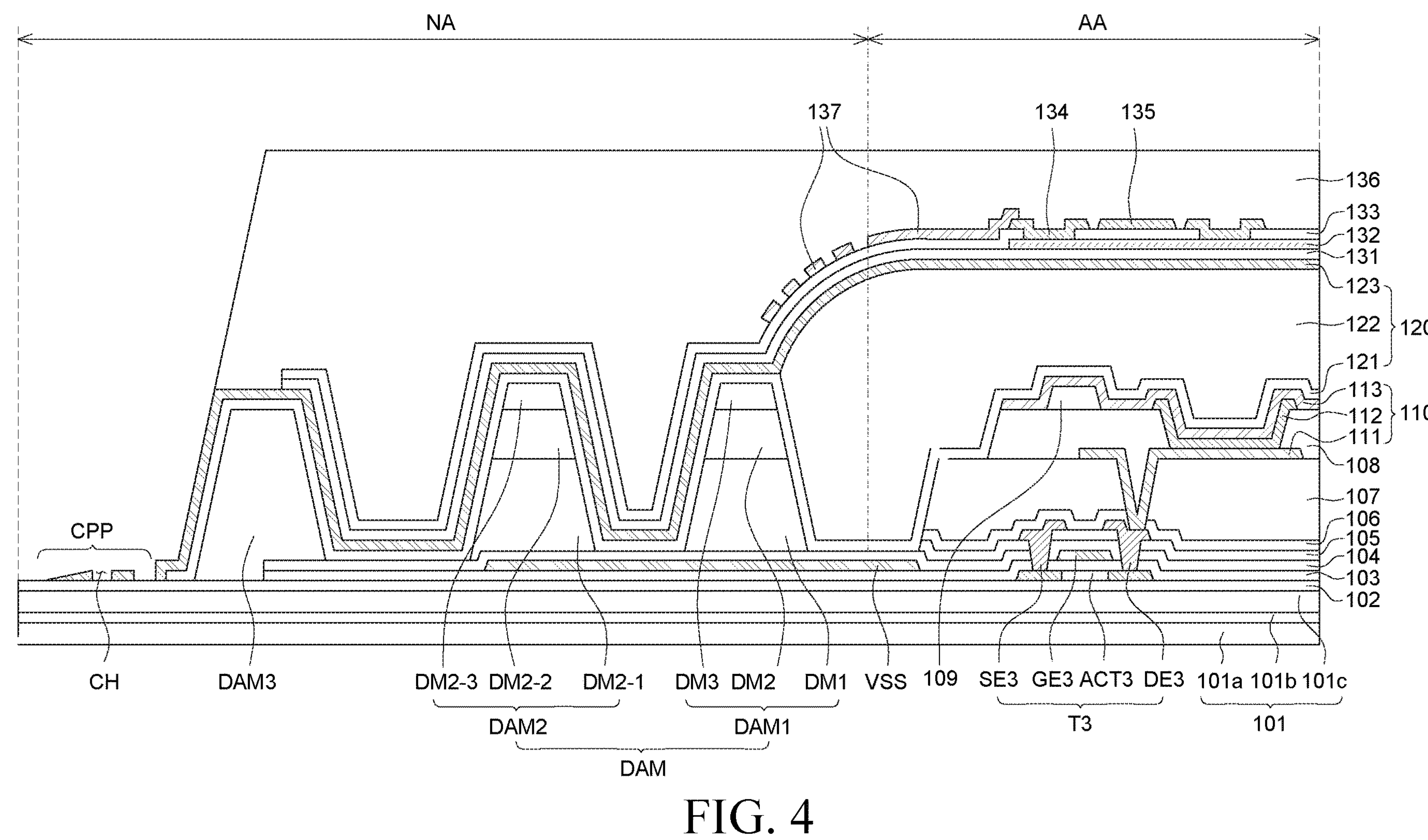
FIG. 4 is a cross-sectional view illustrating the display area and a non-display area of the display device according to an embodiment of the present specification.

The light emission drive parts EM1(1) to EM1(*n*) may output a light emission signal EM in response to the gate control signal GDC from the timing controller TC. FIG. 3 is a cross-sectional view of the display device according to the embodiment of the present specification. FIG. 4 is a cross-sectional view illustrating the non-display area of the display device according to the embodiment of the present specification.

For convenience of description, FIGS. 3 and 4 illustrate only a substrate 101, a third transistor T3, a storage capacitor Cst, a buffer layer 102, a gate insulation layer 103, interlayer insulation layers 104 and 105, a passivation layer 106, an overcoating layer 107, a light-emitting element 110, a bank layer 108, an encapsulation part 120, and a touch part 130.

With reference to FIGS. 3 and 4, the display device 100 according to the embodiment of the present specification includes the substrate 101, the third transistor T3, the storage capacitor Cst, the gate insulation layer 103, the interlayer insulation layers 104 and 105, the overcoating layer 107, the light-emitting element 110, the bank layer 108, the encapsulation part 120, and the touch part 130.

The substrate 101 may support various constituent elements of the display device 100. The substrate 101 may be made of a plastic material having flexibility. In the case in which the substrate 101 is made of a plastic material, the substrate 110 may be made of polyimide (PI), for example. In case that the substrate 101 is made of polyimide (PI), a moisture component penetrates the substrate 101, which is made of polyimide (PI), and penetrates into the third transistor T3 or the light-emitting element 110, which may degrade the performance of the display device 100.

The display device 100 according to the embodiment of the present specification may include two polyimide (PI) layers to suppress the degradation of the performance of the display device 100 caused by the moisture penetration. Further, an inorganic layer is formed between the two polyimide (PI) layers, which may inhibit the moisture component from penetrating the polyimide (PI) layer disposed at a lower side, thereby improving the performance and reliability of the product.

In addition, in case that an inorganic layer is formed between the two polyimide (PI) layers, electric charges, which are charged in the polyimide (PI) layer provided at the lower side, create back bias that may affect a transistor T3.

Therefore, a separate metal layer needs to be formed to block the electric charges charged in the polyimide (PI) layer. However, in the display device 100 according to the embodiment of the present specification, the inorganic layer is formed between the two polyimide (PI) layers, which may block the electric charges charged in the polyimide (PI) layer disposed at the lower side, thereby improving the reliability of the product. Further, because it is possible to exclude a process of forming a metal layer for blocking electric charges charged in the polyimide (PI) layer, it is possible to simplify the process and reduce the production costs.

For example, the substrate 101 of the display device 100 may include a first plastic substrate 101*a*, a second plastic substrate 101*c*, and an inorganic layer 101*b* formed between the first plastic substrate 101*a* and the second plastic substrate 101*c*. The first plastic substrate 101*a* may be referred to as a first organic layer, and the second plastic substrate 101*c* may be referred to as a second organic layer. In case that the first plastic substrate 101*a* is charged with electric charges, the inorganic layer 101*b* may serve to inhibit the electric charges from affecting the transistor T3 through the second plastic substrate 101*c*. Further, the inorganic layer 101*b* formed between the first plastic substrate 101*a* and the second plastic substrate 101*c* may serve to inhibit the moisture component from penetrating into the first plastic substrate 101*a*. The inorganic layer 101*b* may be configured as a single layer or multilayer made of silicon nitride (SiNx) or silicon oxide (SiOx). However, the present specification is not limited thereto.

The buffer layer 102 may be disposed on the substrate 101. The buffer layer 102 may be formed on an entire surface of the substrate 101. The buffer layer 102 may be configured as a single layer or multilayer made of silicon nitride (SiNx) or silicon oxide (SiOx). The buffer layer 102 may serve to increase bonding forces between the substrate 101 and layers formed on the buffer layer 102 and block a leak of an alkaline material from the substrate 101. Further, the buffer layer 102 is not the essential constituent element. The buffer layer 102 may be eliminated depending on the type and material of the substrate 101, the structure and type of the transistor, and the like.

The third transistor T3 may be disposed on the buffer layer 102. The third transistor T3 may include a third active layer ACT3, a third gate electrode GE3, a third source electrode SE3, and a third drain electrode DE3. The third active layer ACT3 of the third transistor T3 may be disposed on the buffer layer 102.

The third active layer ACT3 may be made of a semiconductor material such as an oxide semiconductor, amorphous silicon, or polysilicon, but the present specification is not limited thereto.

The gate insulation layer 103 may be disposed on the third active layer ACT3 of the third transistor T3. The gate insulation layer 103 may be a single layer made of silicon nitride (SiNx) or silicon oxide (SiOx) or a multilayer including the above-mentioned layers. A contact hole, through which the third source electrode SE3 and the third drain electrode DE3 of the third transistor T3 are connected to the third active layer ACT3 of the third transistor T3, may be formed in the gate insulation layer 103.

The third gate electrode GE3 of the third transistor T3 may be disposed on the gate insulation layer 103. The third gate electrode GE3 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. The third gate electrode GE3 may be formed on the gate insulation layer 103 and overlap the third active layer ACT3 of the third transistor T3.

A first interlayer insulation layer 104 may be disposed on the gate insulation layer 103 and the third gate electrode GE3. The first interlayer insulation layer 104 may be a single layer made of silicon nitride (SiNx) or silicon oxide (SiOx) or a multilayer including the above-mentioned layers. A contact hole, through which the third active layer ACT3 of the third transistor T3 is exposed, may be formed in the first interlayer insulation layer 104.

A second interlayer insulation layer 105 may be disposed on the first interlayer insulation layer 104. A contact hole, through which the third active layer ACT3 of the third transistor T3 is exposed, may be formed in the second interlayer insulation layer 105. The second interlayer insulation layer 105 may be a single layer made of silicon nitride (SiNx) or silicon oxide (SiOx) or a multilayer including the above-mentioned layers.

The third source electrode SE3 and the third drain electrode DE3 of the third transistor T3 may be disposed on the second interlayer insulation layer 105.

The third source electrode SE3 and the third drain electrode DE3 of the third transistor T3 may be connected to the third active layer ACT3 of the third transistor T3 through the contact holes formed in the gate insulation layer 103, the first interlayer insulation layer 104, and the second interlayer insulation layer 105. Therefore, the third source electrode SE3 of the third transistor T3 may be connected to the third active layer ACT3 through the contact holes formed in the gate insulation layer 103, the first interlayer insulation layer 104, and the second interlayer insulation layer 105. Further, the third drain electrode DE3 of the third transistor T3 may be connected to the third active layer ACT3 through the contact holes formed in the gate insulation layer 103, the first interlayer insulation layer 104, and the second interlayer insulation layer 105.

Although not shown in FIG. 3, the active layer ACT, the gate electrode GE, the source electrode SE and the drain electrode DE of the driving transistor DT are located on the same layer as the third active layer ACT3, the third gate electrode GE3, the third source electrode SE3 and the third drain electrode DE3 of the third transistor T3, respectively. That is, the gate insulation layer 103 is disposed between the active layer ACT of the driving transistor DT and the gate electrode GE of the driving transistor DT, and the first interlayer insulation layer 104 is disposed between the gate electrode GE of the driving transistor DT and the source electrode SE and the drain electrode DE of the driving transistor DT.

The storage capacitor Cst may include a first capacitor electrode Cst1 and a second capacitor electrode Cst2.

The first capacitor electrode Cst1 may be disposed on the gate insulation layer 103. The first capacitor electrode Cst1 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. The first capacitor electrode Cst1 may be made of the same material as the third gate electrode GE3. However, the present specification is not limited thereto.

The second capacitor electrode Cst2 may be disposed on the first interlayer insulation layer 104. The second capacitor electrode Cst2 may be disposed on the first interlayer insulation layer 104 and overlap the first capacitor electrode Cst1. For example, the second capacitor electrode Cst2 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof.

The passivation layer 106 may be disposed on the third source electrode SE3 and the third drain electrode DE3 of the third transistor T3 and the second interlayer insulation layer 105. The passivation layer 106 may be an insulation layer for protecting elements disposed below the passivation layer 106. The passivation layer 106 may be a single layer made of silicon nitride (SiNx) or silicon oxide (SiOx) or a multilayer including the above-mentioned layers.

The overcoating layer 107 may be disposed on the passivation layer 106. The overcoating layer 107 may be a planarization layer for mitigating a level difference of a lower structure and made of an organic material such as acrylic resin, epoxy resin, phenolic resin, polyamide-based resin, polyimide-based resin, unsaturated polyester-based resin, polyphenylene-based resin, polyphenylene sulfide-based resin, benzocyclobutene, or photoresist. However, the present specification is not limited thereto.

The light-emitting element 110 may be disposed on the overcoating layer 107.

The light-emitting element 110 may include a first electrode 111, a light-emitting structure 112, and a second electrode 113.

The first electrode 111 may be disposed on the overcoating layer 107.

The first electrode 111 may be an anode electrode and be electrically connected to the third drain electrode DE3 of the third transistor T3 through the contact hole.

Because the display device 100 according to the embodiment of the present specification is a top emission display device, the first electrode 111 may have a multilayer structure including a transparent conductive layer and a reflective layer with high reflection efficiency. The transparent conductive layer may be made of a material such as indium-tin-oxide (ITO) or indium-zinc-oxide (IZO) having a comparatively large work function value. Further, the opaque conductive layer may have a single-layered or multilayered structure made of aluminum (Al), silver (Ag), copper (Cu), lead (Pb), molybdenum (Mo), titanium (Ti), or an alloy thereof. For example, the first electrode 111 may have a structure in which the transparent conductive layer, the opaque conductive layer, and the transparent conductive layer are sequentially stacked. However, the present specification is not limited thereto. The first electrode may have a structure in which the transparent conductive layer and the opaque conductive layer are sequentially stacked.

The bank layer 108 may be disposed on the first electrode 111 and the overcoating layer 107.

The bank layer 108 may have an opening portion through which the first electrode 111 is exposed. Because the bank layer 108 may define a light-emitting area of the display device 100, the bank layer 108 may be referred to as a pixel definition layer. The bank layer 108 may be made of an organic material such as acrylic resin, epoxy resin, phenolic resin, polyamide-based resin, polyimide-based resin, unsaturated polyester-based resin, polyphenylene-based resin, polyphenylene sulfide-based resin, benzocyclobutene, or photoresist. However, the present specification is not limited thereto.

A spacer 109 may be further disposed on the bank layer 108.

The spacer 109 may serve to support a mask when the mask is aligned on the bank layer 108 during a process depositing the first electrode 111. The spacer 109 may be integrated with the bank layer 108. The spacer 109 may be made of an organic material such as acrylic resin, epoxy resin, phenolic resin, polyamide-based resin, polyimide-based resin, unsaturated polyester-based resin, polyphenylene-based resin, polyphenylene sulfide-based resin, benzocyclobutene, or photoresist. However, the present specification is not limited thereto.

The light-emitting structure 112 may be disposed on the first electrode 111. The light-emitting structure 112 may include a material capable of emitting light with a particular color. For example, the light-emitting structure 112 may include a light-emitting material capable of emitting any one of red light, green light, and blue light. Specifically, the light-emitting structure 112 may include at least one layer among a hole injection layer (HIL), a hole transport layer (HTL), a light-emitting layer (emission layer (EML)), an electron transport layer (ETL), and an electron injection layer (EIL). Some constituent elements of the light-emitting structure 112 may be excluded depending on the structure or properties of the display device 100.

The second electrode 113 may be further disposed on the light-emitting structure 112. The second electrode 113 may be a cathode electrode and be disposed on the light-emitting structure 112 so as to be opposite to the first electrode 111 with the light-emitting structure 112 interposed therebetween. The second electrode 113 supplies electrons to the light-emitting structure 112. For example, the second electrode 113 may be made of an electrically conductive material with a low work function. In case that the display device 100 is the top emission display device, the second electrode 113 may be made of a transparent conductive oxide, such as indium tin oxide or indium zinc oxide, or a transparent conductive material such as ytterbium (Yb). However, the present specification is not limited thereto.

The encapsulation part 120 for suppressing the penetration of moisture may be further disposed on the second electrode 113.

The encapsulation part 120 may include a first encapsulation layer 121, a second encapsulation layer 122, and a third encapsulation layer 123.

The first encapsulation layer 121 may be disposed on the second electrode 113. The first encapsulation layer 121 may be made of a transparent inorganic material that has an excellent effect of blocking the moisture penetration into the light-emitting element 130 and may be deposited at a low temperature. For example, the first encapsulation layer 121 may be made of an inorganic material such as silicon nitride (SiNx) or silicon oxide (SiOx). However, the present specification is not limited thereto.

The second encapsulation layer 122 may be disposed on the first encapsulation layer 121. The second encapsulation layer 122 is an organic layer capable of compensating for a level difference caused by foreign substances by covering the foreign substances that may occur during the manufacturing process. The foreign substances, which occur during the manufacturing process, may cause a defect of the light-emitting element 110 or crack the inorganic layer such as the first encapsulation layer 121 or the third encapsulation layer 123. Therefore, the second encapsulation layer 122 may serve to cover cracks caused by foreign substances or compensate for a level difference caused by foreign substances. In addition, the second encapsulation layer 122 may also serve to planarize a surface on the light-emitting element 110. The second encapsulation layer 122 may be made of an organic material. For example, the second encapsulation layer 122 may be made of an organic material such as acrylic resin, epoxy resin, phenolic resin, polyamide-based resin, polyimide-based resin, unsaturated polyester-based resin, polyphenylene-based resin, polyphenylene sulfide-based resin, benzocyclobutene, or photoresist. However, the present specification is not limited thereto.

The third encapsulation layer 123 may be disposed on the second encapsulation layer 122. The third encapsulation layer 123 may be made of a transparent inorganic material that has an excellent effect of blocking the moisture penetration into the light-emitting element 130 and may be deposited at a low temperature. For example, the third encapsulation layer 123 may be made of an inorganic material such as silicon nitride (SiNx) or silicon oxide (SiOx). However, the present specification is not limited thereto.

The touch part 130 may be disposed on the third encapsulation layer 123. The touch part 130 may include a touch buffer layer 131, a bridge 132, a touch interlayer insulation layer 133, a first touch electrode 134, a second touch electrode 135, and a protective layer 136.

The touch buffer layer 131 may be a buffer layer positioned on a lowermost portion of the touch part 130 and be made of an inorganic material. For example, the touch buffer layer may be configured as a single layer or multilayer made of silicon nitride (SiNx) or silicon oxide (SiOx). The touch buffer layer 131 may improve a bonding force between the third encapsulation layer 123 and layers formed on the touch buffer layer 131.

The bridge 132 may be disposed on the touch buffer layer 131. The bridge 132 may electrically connect the plurality of first touch electrodes 134 adjacent to one another. The bridge 132 may be made of a transparent metal oxide, such as indium-tin-oxide (ITO) or indium-zinc-oxide (IZO), aluminum (Al), silver (Ag), copper (Cu), lead (Pb), molybdenum (Mo), titanium (Ti), or an alloy thereof.

The touch interlayer insulation layer 133 may be disposed on the touch buffer layer 131 and the bridge 132. The touch interlayer insulation layer 133 may be made of an inorganic material such as silicon nitride (SiNx) or silicon oxide (SiOx). However, the present specification is not limited thereto.

The first touch electrode 134 and the second touch electrode 135 may be disposed on the touch interlayer insulation layer 133. Although not illustrated in the drawings, the first touch electrodes 134 may be arranged in a first direction in a plan view, and the second touch electrodes 135 may be arranged in a second direction that is a direction different from the first direction.

The first touch electrode 134 may be electrically connected to the bridge 132 through a contact hole formed in the touch interlayer insulation layer 133. Therefore, the plurality of first touch electrodes 134 arranged in the first direction may be electrically connected to one another by the bridge 132.

In addition, although not illustrated in the drawings, a connection pattern may be formed on the touch interlayer insulation layer 133, such that the plurality of second touch electrodes 135, which are arranged in the second direction different from the first direction, may be electrically connected to one another.

The protective layer 136 may be disposed on the first touch electrode 134, the second touch electrode 135, and the touch interlayer insulation layer 133. The protective layer 136 may be made of an organic material such as acrylic resin, epoxy resin, phenolic resin, polyamide-based resin, polyimide-based resin, unsaturated polyester-based resin, polyphenylene-based resin, polyphenylene sulfide-based resin, benzocyclobutene, or photoresist. However, the present specification is not limited thereto.

The touch part 130 may further include a plurality of touch routing lines 137. The first touch electrode 134 and the second touch electrode 135 may be electrically connected to a touch drive part, which operates the touch part 130, through the touch routing lines 137.

With reference to FIG. 4, an auxiliary metal layer VSSL may be disposed on the gate insulation layer 103 in the non-display area NA. The auxiliary metal layer VSSL, which is disposed on the same layer and made of the same material as the metal layers in the display area AA, may be disposed in the non-display area NA. The auxiliary metal layer VSSL may also serve as a line for supplying the low-potential voltage Vss. The auxiliary metal layer VSSL may be disposed on the same layer and made of the same material as the third source electrode SE3 and the third drain electrode DE3 of the third transistor T3. However, the present specification is not limited thereto. The auxiliary metal layer may be disposed on the same layer and made of the same material as the third gate electrode GE3.

A dam DAM may be disposed in the non-display area NA and inhibit the second encapsulation layer 122 from collapsing. That is, the dam DAM may serve to inhibit an organic material layer included in the encapsulation part 120 from overflowing to the outer periphery. The dam DAM may be positioned at a boundary point between the display area AA and the non-display area NA or any one point in the non-display area NA. The dam DAM may be disposed to surround the display area AA in all directions or disposed only at an outer periphery of a part of the display area AA. Only one dam DAM may be disposed, or two or more dams DAM may be disposed. For example, the dam DAM includes a first dam DAM1, a second dam DAM2, and a third dam DAM3.

The first dam DAM1 may be disposed adjacent to the display area AA and surround the display area AA, and the first dam DAM1 may primarily block a flow of the second encapsulation layer 122 of the encapsulation part 120. The second dam DAM2 may surround an outer periphery of the first dam DAM1, and the third dam DAM3 may surround an outer periphery of the second dam DAM2.

The first dam DAM1 and the second dam DAM2 may be disposed on the first interlayer insulation layer 104 and overlap the auxiliary metal layer VSSL.

The first dam DAM1 and the second dam DAM2 may each be configured as a single layer or multilayer. For example, the first dam DAM1 may include a first layer DM1 of the first dam, a second layer DM2 of the first dam, and a third layer DM3 of the first dam. The second dam DAM2 may include a first layer DM2-1 of the second dam, a second layer DM2-2 of the second dam, and a third layer DM2-3 of the second dam. The first layer DM1 of the first dam and the first layer DM2-1 of the second dam may be disposed on the first interlayer insulation layer 104.

The first layer DM1 of the first dam and the first layer DM2-1 of the second dam may be formed by the same process as the overcoating layer 107 and made of the same material as the overcoating layer 107.

The second layer DM2 of the first dam may be disposed on the first layer DM1 of the first dam, and the second layer DM2-2 of the second dam may be disposed on the first layer DM2-1 of the second dam. The second layer DM2 of the first dam and the second layer DM2-2 of the second dam may be formed by the same process as the bank layer 108 and made of the same material as the bank layer 108.

The third layer DM3 of the first dam may be disposed on the second layer DM2 of the first dam, and a third layer DM2-3 of the second dam may be disposed on the second layer DM2-2 of the second dam. The third layer DM3 of the first dam and the third layer DM2-3 of the second dam may be formed by the same process as the spacer 109 and made of the same material as the spacer 109.

In the embodiment of the present specification, the display device 100 is illustrated as including the two dams DAM1 and DAM2 each having the three layers. However, the present specification is not limited thereto. For example, the dam DAM may have two layers or four or more layers.

The third dam DAM3 may be disposed to surround the second dam DAM2 and block a flow of the protective layer 136. The third dam DAM3 may be configured as a single layer or multilayer. For example, the third dam DAM3 may be configured as a single layer. The third dam DAM3 may be formed by the same process as the overcoating layer 107 and made of the same material as the overcoating layer 107. The third dam DAM3 may be disposed at an outer periphery of the second dam DAM2 and cover an end of the first interlayer insulation layer 104 and an end of the second interlayer insulation layer 105. Because the end of the first interlayer insulation layer 104 and the end of the second interlayer insulation layer 105 are vulnerable to damage, the third dam DAM3 may suppress the damage by covering the end of the first interlayer insulation layer 104 and the end of the second interlayer insulation layer 105. A crack suppression pattern CPP may be disposed at an outer periphery of the third dam DAM3. The crack suppression pattern CPP may be disposed to surround the outer periphery of the third dam DAM3. The crack suppression pattern CPP may include an opening portion CH formed through the third encapsulation layer 123. That is, the crack suppression pattern CPP may be made by patterning the third encapsulation layer 123 to inhibit the encapsulation part 120 from cracking and inhibit the crack from propagating toward the display area AA. The substrate 101 may be exposed to the outside through the opening portion CH.

Figure 5:
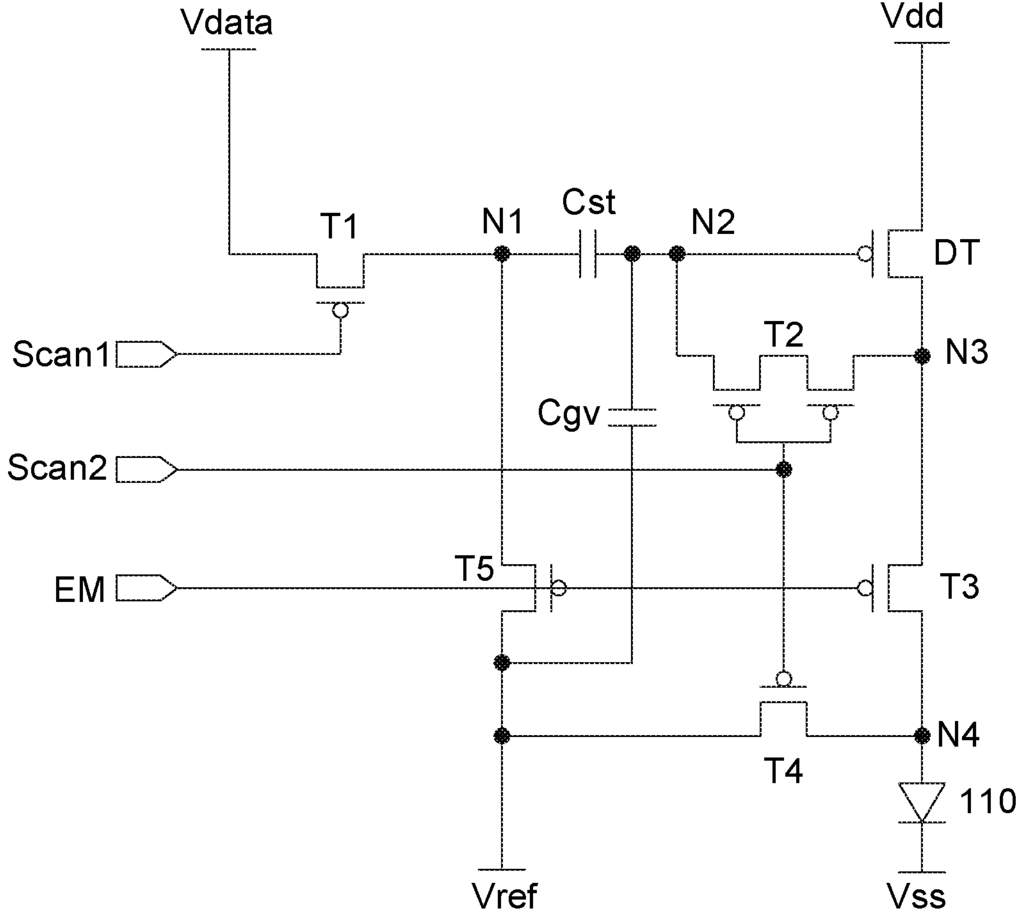
FIG. 5 is a view illustrating an example of a subpixel circuit of the display device according to an embodiment of the present specification.

FIG. 5 is a view illustrating an example of a subpixel circuit of the display device according to the embodiment of the present specification.

With reference to FIG. 5, the subpixel circuit may include six transistors, one storage capacitor Cst, and the light-emitting element 110.

For example, the subpixel circuit may include a driving transistor DT, a first transistor T1, a second transistor T2, the third transistor T3, a fourth transistor T4, a fifth transistor T5, the storage capacitor Cst, and the light-emitting element 110. The subpixel circuit including six transistors and one storage capacitor may be referred to as a pixel circuit of 6TIC. However, the present specification is not limited by this term. FIG. 5 illustrates that the driving transistor DT, the first transistor T1, the second transistor T2, the third transistor T3, the fourth transistor T4, and the fifth transistor T5 are implemented as p-type transistors. However, the present specification is not limited thereto. In the case of the p-type transistor, a low-level voltage of each of the driving signals may mean a voltage that turns on the transistors, and a high-level voltage of each of the driving signals may mean a voltage that turns off the transistors.

The first or second electrode of the transistor, which will be described below, may mean the source or drain electrode. However, the terms 'first electrode' and 'second electrode' are just terms for distinguishing the electrodes. What corresponds to the electrode is not limited. In addition, for each electrode, the first electrode may not refer to the same electrode.

The high-potential voltage Vdd, the low-potential voltage Vss, the reference voltage Vref, and a data voltage Vdata may be supplied to the subpixel circuit. The high-potential voltage Vdd, the low-potential voltage Vss, and the reference voltage Vref may be DC voltages (or direct current voltages), and the data voltage Vdata may be an AC voltage (or alternating current voltage). However, the present specification is not limited thereto.

The subpixel circuit may be connected to a high-potential voltage line for supplying the high-potential voltage Vdd, a low-potential voltage line for supplying the low-potential voltage Vss, a reference voltage line for supplying the reference voltage Vref, and a data line for supplying the data voltage Vdata. The high-potential voltage Vdd may be referred to as a first voltage, and the low-potential voltage Vss may be referred to as a second voltage having a smaller value than the first voltage. However, the present specification is not limited thereto.

The high-potential voltage Vdd may have a higher voltage value than the low-potential voltage Vss and the reference voltage Vref. The low-potential voltage Vss may be equal to or lower than the reference voltage Vref. The data voltage Vdata may have a voltage value within a particular range. For example, the data voltage Vdata may have a value between 0 and 10V (volt). However, the present specification is not limited thereto.

The driving transistor DT may be a transistor for operating the light-emitting element 110 and control a drive current, which is to be applied to the light-emitting element 110, in accordance with a source-gate voltage. A first electrode of the driving transistor DT may be connected to a high-potential voltage line. A second electrode of the driving transistor DT may be connected to a third node N3. A gate electrode of the driving transistor DT may be connected to a second node N2. The driving transistor DT may be turned on or off in response to a voltage of the second node N2. When the driving transistor DT is turned on, the driving transistor DT may supply the high-potential voltage Vdd, which is supplied by the high-potential voltage line, to the third node N3.

The first transistor T1 may provide the data voltage Vdata to a first node N1 from the data line that provides the data voltage Vdata. A first electrode of the first transistor T1 may be connected to the data line. A second electrode of the first transistor T1 may be connected to the first node N1. For example, the second electrode of the first transistor T1 may be connected to the storage capacitor Cst and connected to a first electrode of the fifth transistor T5.

A gate electrode of the first transistor T1 may be connected to a first scan line that provides the first scan signal Scan1. The first transistor T1 may be turned on or off in response to the first scan signal Scan1. When the first transistor T1 is turned on, the first transistor T1 may connect the first node N1 and the data line. In this case, the data voltage Vdata is provided to the first node N1 through the data line.

The second transistor T2 may diode-connect the gate electrode and the drain electrode of the driving transistor DT. A first electrode of the second transistor T2 may be connected to the second node N2. The first electrode of the second transistor T2 may be connected to the storage capacitor Cst and the gate electrode of the driving transistor DT. A second electrode of the second transistor T2 may be connected to the third node N3. The second electrode of the second transistor T2 may be connected to a first electrode of the third transistor T3 and the second electrode of the driving transistor DT.

A gate electrode of the second transistor T2 may be connected to a second scan line that provides the second scan signal Scan2. The second transistor T2 may be turned on or off in response to the second scan signal Scan2. When the second transistor T2 is turned on, the second transistor T2 may connect the second node N2 and the third node N3.

The second transistor T2 may include a plurality of sub-transistors. In this case, the second transistor T2 may be referred to as a multi-transistor, a double transistor, or a dual transistor. Alternatively, the second transistor T2 may include a plurality of gate electrodes. In this case, the second transistor T2 may be referred to as a multi-gate transistor, a double gate transistor, or a dual gate transistor.

In case that the second transistor T2 includes a plurality of sub-transistors or a plurality of gate electrodes, the amount of electric current leaking from the second transistor T2, e.g., the amount of leakage current between the second node N2 and the reference voltage line may be effectively reduced.

The third transistor T3 may define a current path between the driving transistor DT and the light-emitting element 110. The third transistor T3 may be connected between the third node N3 and a fourth node N4. The first electrode of the third transistor T3 may be connected to the third node N3. For example, the first electrode of the third transistor T3 may be connected to the second electrode of the second transistor T2 and the second electrode of the driving transistor DT. A second electrode of the third transistor T3 may be connected to the fourth node N4. For example, the second electrode of the third transistor T3 may be connected to the second electrode of the fourth transistor T4 and the light-emitting element 110.

A gate electrode of the third transistor T3 may be connected to a light emission signal line that provides the light emission signal EM. The third transistor T3 may be turned on or off in response to the light emission signal EM provided through the light emission signal line. When the third transistor T3 is turned on, the third transistor T3 may define a current path between the driving transistor DT and the light-emitting element 110 by connecting the third node N3 and the fourth node N4.

The fourth transistor T4 may apply the reference voltage Vref to a first electrode of the light-emitting element 110. The fourth transistor T4 may be connected to the reference voltage line, which supplies the reference voltage Vref, the fifth transistor T5, and the fourth node N4. A first electrode of the fourth transistor T4 may be connected to the fifth transistor T5 and the reference voltage line. For example, the first electrode of the fourth transistor T4 may be connected to a second electrode of the fifth transistor T5 and the reference voltage line. A second electrode of the fourth transistor T4 may be connected to the fourth node N4. The second electrode of the fourth transistor T4 may be connected to the third transistor T3 and the light-emitting element 110. For example, the second electrode of the fourth transistor T4 may be connected to the second electrode of the third transistor T3 and the first electrode of the light-emitting element 110.

A gate electrode of the fourth transistor T4 may be connected to a second scan line that provides the second scan signal Scan2. The fourth transistor T4 may be turned on or off in response to the second scan signal Scan2 provided through the second scan line. When the fourth transistor T4 is turned on, the fourth transistor T4 may charge the fourth node N4 with the reference voltage Vref by connecting the fourth node N4 and the reference voltage line.

In case that the fourth node N4 is charged with the reference voltage Vref as described above, the effect of increasing the voltage of the electrode, which is connected to the fourth node N4 of the light-emitting element 110, e.g., the first electrode may be reduced even though the second transistor T2 is turned on. As the increase in voltage of the first electrode is reduced, an initial peak phenomenon in which a voltage excessively increases in an initial section may be reduced. Because the initial peak is reduced, it is possible to suppress a luminance imbalance, e.g., a black spot phenomenon at an edge and center of the display panel and improve luminance uniformity.

The fifth transistor T5 may apply the reference voltage Vref to the first node N1. The first electrode of the fifth transistor T5 may be connected to the first node N1. For example, the first electrode of the fifth transistor T5 may be connected to the storage capacitor Cst and connected to the second electrode of the first transistor T1. The second electrode of the fifth transistor T5 may be connected to the fourth transistor T4 and the reference voltage line that provides the reference voltage Vref. For example, the second electrode of the fifth transistor T5 may be connected to the first electrode of the fourth transistor T4 and the reference voltage line.

A gate electrode of the fifth transistor T5 may be connected to the light emission signal line that provides the light emission signal EM. The fifth transistor T5 may be turned on or off in response to the light emission signal EM inputted through the light emission signal line. When the fifth transistor T5 is turned on, the fifth transistor T5 may charge the first node N1 with the reference voltage Vref by connecting the first node N1 and the reference voltage line.

The light-emitting element 110 may be connected between the fourth node N4 and the low-potential voltage line that supplies the low-potential voltage Vss. For example, the first electrode of the light-emitting element 110 may be connected to the fourth node N4, and a second electrode of the light-emitting element 110 may be connected to the low-potential voltage line. The low-potential voltage Vss may be a voltage lower than the above-mentioned high-potential voltage Vdd. For example, the voltage, which is supplied through the low-potential voltage line, may include a ground voltage. The low-potential voltage Vss and the high-potential voltage Vdd may each be set in advance.

The storage capacitor Cst may be connected between the first node N1 and the second node N2. For example, a first capacitor electrode of the storage capacitor Cst may be connected to the second node N2 connected to the gate electrode of the driving transistor DT. A second capacitor electrode of the storage capacitor Cst may be connected to the first node N1 connected to the first transistor T1 and the fifth transistor T5.

The storage capacitor Cst may be configured to charge electrical energy (e.g., electric charges or a data voltage) to maintain a constant voltage for one frame. For example, in case that an input of the data voltage is stopped by the first transistor T1 during an operating process of the subpixel circuit, the storage capacitor Cst provides the stored data voltage to the driving transistor DT to maintain the operation of the driving transistor DT for one frame.

The subpixel circuit may further include an auxiliary capacitor Cgv. The auxiliary capacitor Cgv may be disposed between the first capacitor electrode of the storage capacitor Cst and the reference voltage line that provides the reference voltage Vref. The auxiliary capacitor Cgv may inhibit the voltage of the gate electrode of the driving transistor DT from being increased by a kick-back phenomenon.

The auxiliary capacitor Cgv will be described in more detail with reference to FIGS. 6 and 7.

Figure 6:
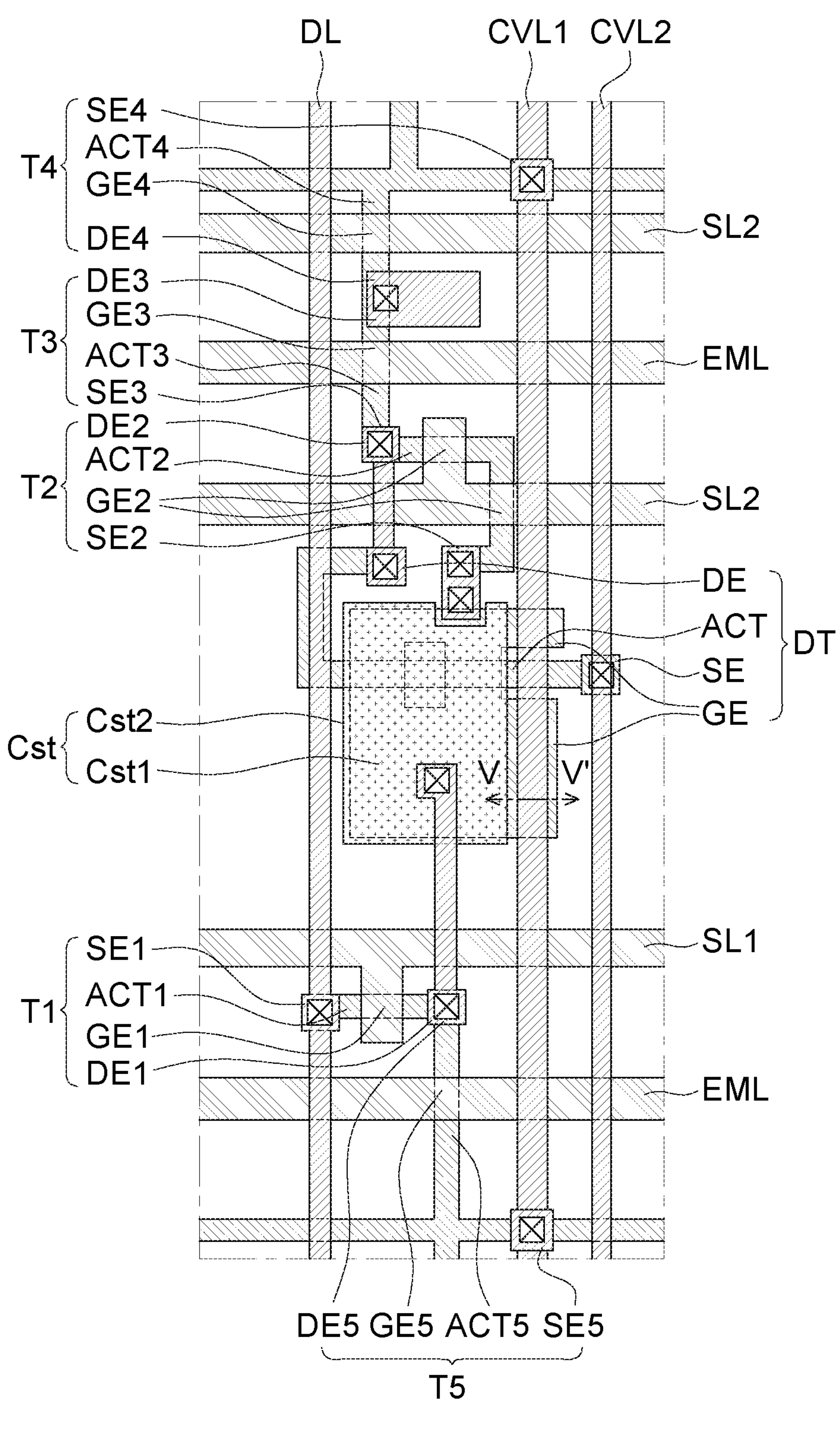
FIG. 6 is a top plan view of the display device according to an embodiment of the present specification.

FIG. 6 is a top plan view of the display device according to the embodiment of the present specification. FIG. 6 illustrates a plane of one subpixel. FIG. 7 is a cross-sectional view taken along line V-V' in FIG. 6 according to an embodiment of the present specification. For convenience of description, FIG. 6 illustrates only the data line DL, a first constant voltage line CVL1, a second constant voltage line CVL2, a first scan signal line SL1, a second scan signal line SL2, a light emission signal line EML, the first transistor T1, the second transistor T2, the third transistor T3, the fourth transistor T4, the fifth transistor T5, the driving transistor DT, the storage capacitor Cst, and the auxiliary capacitor Cgv. For convenience of description, FIG. 7 illustrates only the substrate 101, the buffer layer 102, the gate insulation layer 103, the first interlayer insulation layer 104, the second interlayer insulation layer 105, and the first constant voltage line CVL1.

With reference to FIG. 6, the data line DL, the first constant voltage line CVL1, and the second constant voltage line CVL2 may be disposed in the subpixel and extend in the column direction. The data line DL, the first constant voltage line CVL1, and the second constant voltage line CVL2 may be spaced apart from one another and disposed in parallel with one another. For example, the data line DL, the first constant voltage line CVL1, and the second constant voltage line CVL2 may be sequentially disposed from the left side. The data line DL, the first constant voltage line CVL1, and the second constant voltage line CVL2 may be disposed on the same layer on the substrate 101 and made of the same material. For example, the data line DL, the first constant voltage line CVL1, and the second constant voltage line CVL2 may each be made of an electrically conductive material such as copper (Cu), aluminum (Al), molybdenum (Mo), nickel (Ni), titanium (Ti), chromium (Cr), or an alloy thereof. However, the present specification is not limited thereto.

The data line DL may extend in the column direction in the subpixel and transmit the data voltage Vdata. The data line DL may be electrically connected to the first transistor T1 and transmit the data voltage Vdata to the first transistor T1.

The first constant voltage line CVL1 may extend in the column direction in the subpixel and transmit a first constant voltage at a predetermined voltage level. For example, the first constant voltage line CVL1 may be a reference voltage line that transmits the reference voltage Vref to the subpixel. The first constant voltage line CVL1 may be electrically connected to the fourth transistor T4 and the fifth transistor T5 and transmit the reference voltage Vref to the fourth transistor T4 and the fifth transistor T5.

The second constant voltage line CVL2 may extend in the column direction in the subpixel and transmit a second constant voltage at a predetermined voltage level. For example, the second constant voltage line CVL2 may be a high-potential voltage line that transmits the high-potential voltage Vdd to the subpixel. The second constant voltage line CVL2 may be electrically connected to the driving transistor DT and transmit the high-potential voltage Vdd to the driving transistor DT.

With reference to FIG. 6, the first scan signal line SL1, the second scan signal line SL2, and the light emission signal line EML may be disposed in the subpixel and extend in the row direction. The first scan signal line SL1, the second scan signal line SL2, and the light emission signal line EML may be spaced apart from one another and disposed in parallel with one another. The first scan signal line SL1, the second scan signal line SL2, and the light emission signal line EML may be disposed on the same layer on the substrate 101 and made of the same material. For example, the first scan signal line SL1, the second scan signal line SL2, and the light emission signal line EML may each be made of an electrically conductive material such as copper (Cu), aluminum (Al), molybdenum (Mo), nickel (Ni), titanium (Ti), chromium (Cr), or an alloy thereof. However, the present specification is not limited thereto.

The first scan signal line SL1 may extend in the row direction in the subpixel and intersect the data line DL, the first constant voltage line CVL1, and the second constant voltage line CVL2 extending in the column direction. The first scan signal line SL1 may transmit the first scan signal Scan1 to the subpixel. A part of the first scan signal line SL1 may serve as a second gate electrode GE1 of the first transistor T1.

The second scan signal line SL2 may extend in the row direction in the subpixel and intersect the data line DL, the first constant voltage line CVL1, and the second constant voltage line CVL2 extending in the column direction. The second scan signal line SL2 may transmit the second scan signal Scan2 to the subpixel. A part of the second scan signal line SL2 may serve as a second gate electrode GE2 of the second transistor T2 and a fourth gate electrode GE4 of the fourth transistor T4. FIG. 6 illustrates that two second scan signal lines SL2 are configured to provide the second scan signal Scan2. However, the present disclosure is not limited thereto. One second scan signal line SL2 may be disposed in accordance with design.

The light emission signal line EML may extend in the row direction in the subpixel and intersect the data line DL, the first constant voltage line CVL1, and the second constant voltage line CVL2 extending in the column direction. The light emission signal line EML may transmit the light emission signal EM to the subpixel. A part of the light emission signal line EML may serve as the third gate electrode GE3 of the third transistor T3 and a fifth gate electrode GE5 of the fifth transistor T5. FIG. 6 illustrates that two light emission signal lines EML are configured to provide the light emission signal EM. However, the present disclosure is not limited thereto. One light emission signal line EML may be disposed in accordance with design.

The first transistor T1 may include a first active layer ACT1, a first gate electrode GE1, a first source electrode SE1, and a first drain electrode DE1. The first source electrode SE1 may be electrically connected to the data line DL through a contact hole, and the first drain electrode DE1 may be electrically connected to the storage capacitor Cst. The first gate electrode GE1 may be a part of the first scan signal line SL1 that overlaps the first active layer ACT1.

The second transistor T2 may include a second active layer ACT2, the second gate electrode GE2, a second source electrode SE2, and a second drain electrode DE2. The second source electrode SE2 may be electrically connected to a gate electrode GE of the driving transistor DT and the storage capacitor Cst, and the second drain electrode DE2 may be electrically connected to the third source electrode SE3 of the third transistor T3 and a drain electrode DE of the driving transistor DT. The second gate electrode GE2 may be a part of the second scan signal line SL2 that overlaps the second active layer ACT2.

The third transistor T3 may include the third active layer ACT3, the third gate electrode GE3, the third source electrode SE3, and the third drain electrode DE3. The third source electrode SE3 may be electrically connected to the second drain electrode DE2 of the second transistor T2 and the drain electrode DE of the driving transistor DT. For example, the third source electrode SE3 may be integrated with the second drain electrode DE2. The third drain electrode DE3 may be electrically connected to a fourth drain electrode DE4 of the fourth transistor T4. For example, the third drain electrode DE3 may be integrated with the fourth drain electrode DE4. The third gate electrode GE3 may be a part of the light emission signal line EML that overlaps the third active layer ACT3.

The fourth transistor T4 may include a fourth active layer ACT4, the fourth gate electrode GE4, a fourth source electrode SE4, and a fourth drain electrode DE4. The fourth source electrode SE4 may be electrically connected to the first constant voltage line CVL1 through a contact hole. The fourth drain electrode DE4 may be electrically connected to the third drain electrode DE3 of the third transistor T3. For example, the fourth drain electrode DE4 may be integrated with the third drain electrode DE3. The fourth gate electrode GE4 may be a part of the second scan signal line SL2 that overlaps the fourth active layer ACT4.

The fifth transistor T5 may include a fifth active layer ACT5, the fifth gate electrode GE5, a fifth source electrode SE5, and a fifth drain electrode DE5. The fifth source electrode SE5 may be electrically connected to the first constant voltage line CVL1 through a contact hole. The fifth drain electrode DE5 may be electrically connected to the first drain electrode DE1 of the first transistor T1. For example, the fifth drain electrode DE5 may be integrated with the first drain electrode DE1. The fifth gate electrode GE5 may be a part of the light emission signal line EML that overlaps the fifth active layer ACT5.

The driving transistor DT may include an active layer ACT, the gate electrode GE, a source electrode SE, and the drain electrode DE. The source electrode SE may be electrically connected to the second constant voltage line CVL2 through a contact hole. The drain electrode DE may be electrically connected to the second drain electrode DE2 of the second transistor T2 and the third source electrode SE3 of the third transistor T3. The gate electrode GE may be a part of the first capacitor electrode Cst1 that overlaps the active layer ACT.

The storage capacitor Cst may include the first capacitor electrode Cst1 and the second capacitor electrode Cst2 disposed on the first capacitor electrode Cst1 and configured to overlap the first capacitor electrode Cst1. The first capacitor electrode Cst1 may be electrically connected to the gate electrode GE of the driving transistor DT. For example, the first capacitor electrode Cst1 may be integrated with the gate electrode GE. The second capacitor electrode Cst2 may be electrically connected to the first drain electrode DE1 of the first transistor T1 and the fifth drain electrode DE5 of the fifth transistor T5.

Figure 7:
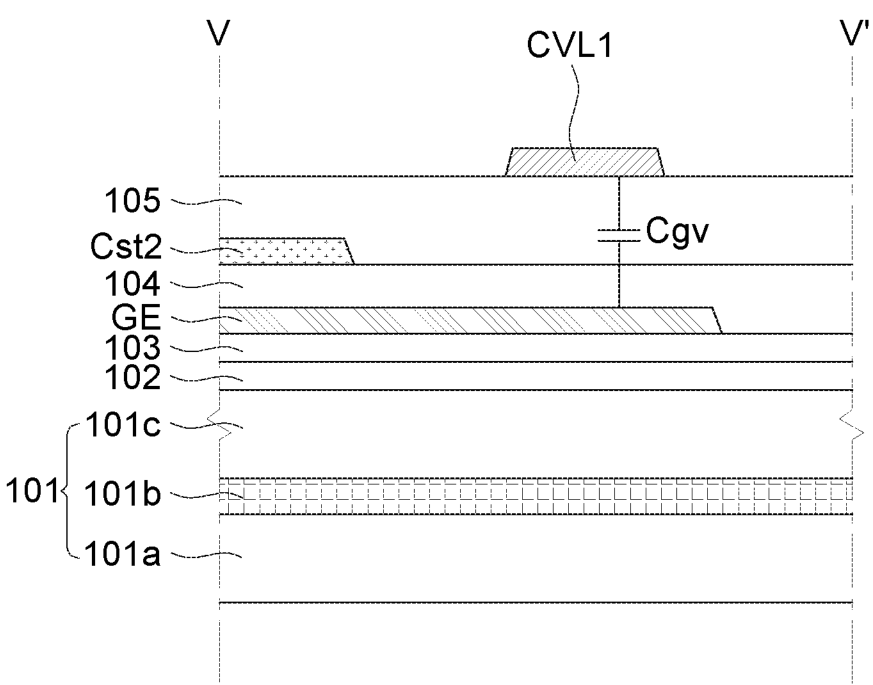
FIG. 7 is a cross-sectional view taken along line V-V' in FIG. 6 according to an embodiment of the present specification.

With reference to FIGS. 6 and 7, the gate electrode GE of the driving transistor DT may overlap the first constant voltage line CVL1. The gate electrode GE of the driving transistor DT may extend and at least partially overlap the first constant voltage line CVL1. For example, the gate electrode GE of the driving transistor DT may overlap the first constant voltage line CVL1 that provides the reference voltage Vref that is a constant voltage. Therefore, the auxiliary capacitor Cgv may be formed between the first constant voltage line CVL1, which provides the first constant voltage, and the gate electrode GE of the driving transistor DT. For example, a first portion of the gate electrode GE of the driving transistor DT may overlap the active layer ACT of the driving transistor DT, and a second portion of the gate electrode GE of the driving transistor DT may extend from the first portion in the direction of the first constant voltage line CVL1. That is, the first portion of the gate electrode GE may overlap the active layer ACT, and the second portion, which extends from the first portion in the direction of the first constant voltage line CVL1, may overlap the first constant voltage line CVL1.

In a display device in the related art, a metal layer is disposed below an active layer of a driving transistor to suppress a situation in which an operation defect occurs as the amount of electric current flowing through the active layer of the driving transistor is reduced by a flow of electric charges on a substrate made of polyimide (PI). In this case, the metal layer is electrically connected to a source electrode of the driving transistor to inhibit the metal layer from floating. Therefore, an auxiliary capacitor is formed between the gate electrode of the driving transistor and the metal layer, such that a problem in which a voltage of the gate electrode of the driving transistor is increased by a kick-back phenomenon may be suppressed.

However, in case that the metal layer is disposed below the active layer of the driving transistor, a separate process of forming the metal layer and a separate mask process of connecting the metal layer to the source electrode are required, which causes a problem in that manufacturing costs are increased, and a manufacturing process is complicated.

For this reason, in case that the metal layer disposed below the driving transistor is removed, the auxiliary capacitor, which is formed by means of the metal layer, may be removed. For this reason, there are problems in that the voltage of the gate electrode of the driving transistor is increased by the kick-back phenomenon, the voltage leaks through the second transistor, the compensation of a threshold voltage occurs at a lower voltage, a compensation error rate is increased, and a luminance deviation of the display device occurs.

Therefore, in the display device 100 according to the embodiment of the present specification, the gate electrode GE of the driving transistor DT and the first constant voltage line CVL1, which provides the first constant voltage, are disposed to overlap each other, such that the auxiliary capacitor Cgv may be formed. Therefore, in the display device 100 according to the embodiment of the present specification, a separate metal layer may be excluded, and a mask process of forming the metal layer may be excluded, such that the manufacturing costs may be reduced, and the manufacturing process may be optimized.

In addition, in the display device 100 according to the embodiment of the present specification, the gate electrode GE of the driving transistor DT and the first constant voltage line CVL1, which transmits the first constant voltage, e.g., the reference voltage Vref, are disposed to overlap each other, such that the auxiliary capacitor Cgv may be formed. Therefore, in the display device 100 according to the embodiment of the present specification, the auxiliary capacitor Cgv may be ensured even though a separate metal layer is excluded. A threshold voltage compensation error rate of the driving transistor DT and a luminance deviation of the display device 100 may be minimized or at least reduced, which may improve the display quality.

Figure 8:
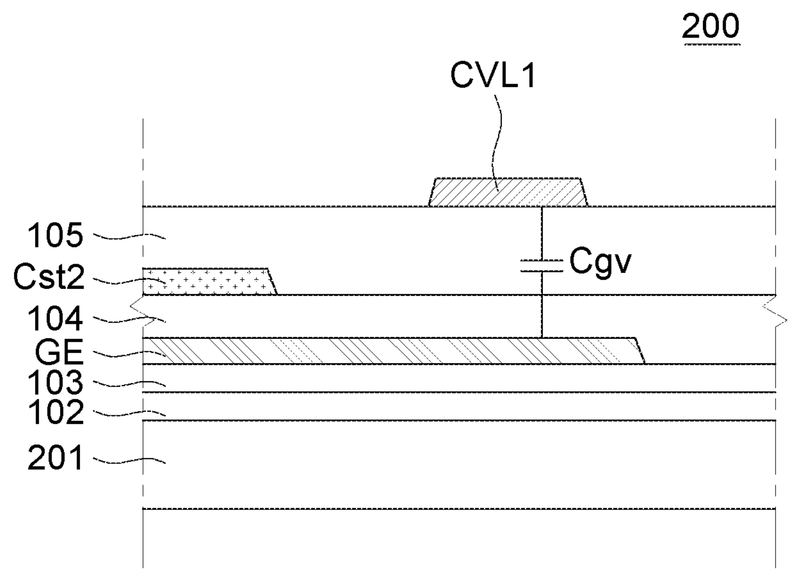
FIG. 8 is a cross-sectional view of a display device according to another embodiment of the present specification.

FIG. 8 is a cross-sectional view of a display device according to another embodiment of the present specification. A display device 200 in FIG. 8 is substantially identical in configuration to the display device 100 in FIGS. 1 to 7, except for a substrate 201. Therefore, repeated descriptions of the identical components will be omitted.

With reference to FIG. 8, the display device 200 according to another embodiment of the present specification includes the substrate 201. The substrate 201 may be made of a glass material and configured as a single layer.

In a display device in the related art, a metal layer is disposed below an active layer of a driving transistor to suppress a situation in which an operation defect occurs as the amount of electric current flowing through the active layer of the driving transistor is reduced by a flow of electric charges in case that a substrate made of polyimide (PI) is used. In case that the metal layer is disposed below the active layer of the driving transistor, a separate mask process of forming the metal layer is required, which causes a problem in that manufacturing costs are increased, and a manufacturing process is complicated.

Therefore, in the display device 200 according to another embodiment of the present specification, the substrate 201 made of a glass material may be provided instead of the substrate 101 made of polyimide (PI). Therefore, in the display device 200 according to another embodiment of the present specification, the problem, in which the amount of electric current flowing through the active layer ACT of the driving transistor DT is reduced, does not occur, such that the metal layer disposed below the driving transistor DT may be excluded. That is, a separate metal layer may be excluded, and a mask process of forming the metal layer may be excluded, such that the manufacturing costs may be reduced, and the manufacturing process may be optimized.

Meanwhile, because the substrate is made of a glass material, the necessity of the separate metal layer may be eliminated. However, in case that the metal layer is removed, the auxiliary capacitor, which is formed by means of the metal layer, may be removed. For this reason, there are problems in that the voltage of the gate electrode of the driving transistor is increased by the kick-back phenomenon, the voltage leaks through the second transistor, the compensation of a threshold voltage occurs at a lower voltage, a compensation error rate is increased, and a luminance deviation of the display device occurs.

Therefore, in the display device 200 according to another embodiment of the present specification, the gate electrode GE of the driving transistor DT and the first constant voltage line CVL1, which transmits the first constant voltage, e.g., the reference voltage Vref, are disposed to overlap each other, such that the auxiliary capacitor Cgv may be formed. Therefore, in the display device 200 according to another embodiment of the present specification, the auxiliary capacitor Cgv may be ensured even though a separate metal layer is excluded. A threshold voltage compensation error rate of the driving transistor DT and a luminance deviation of the display device 200 may be minimized, which may improve the display quality.

Figure 9:
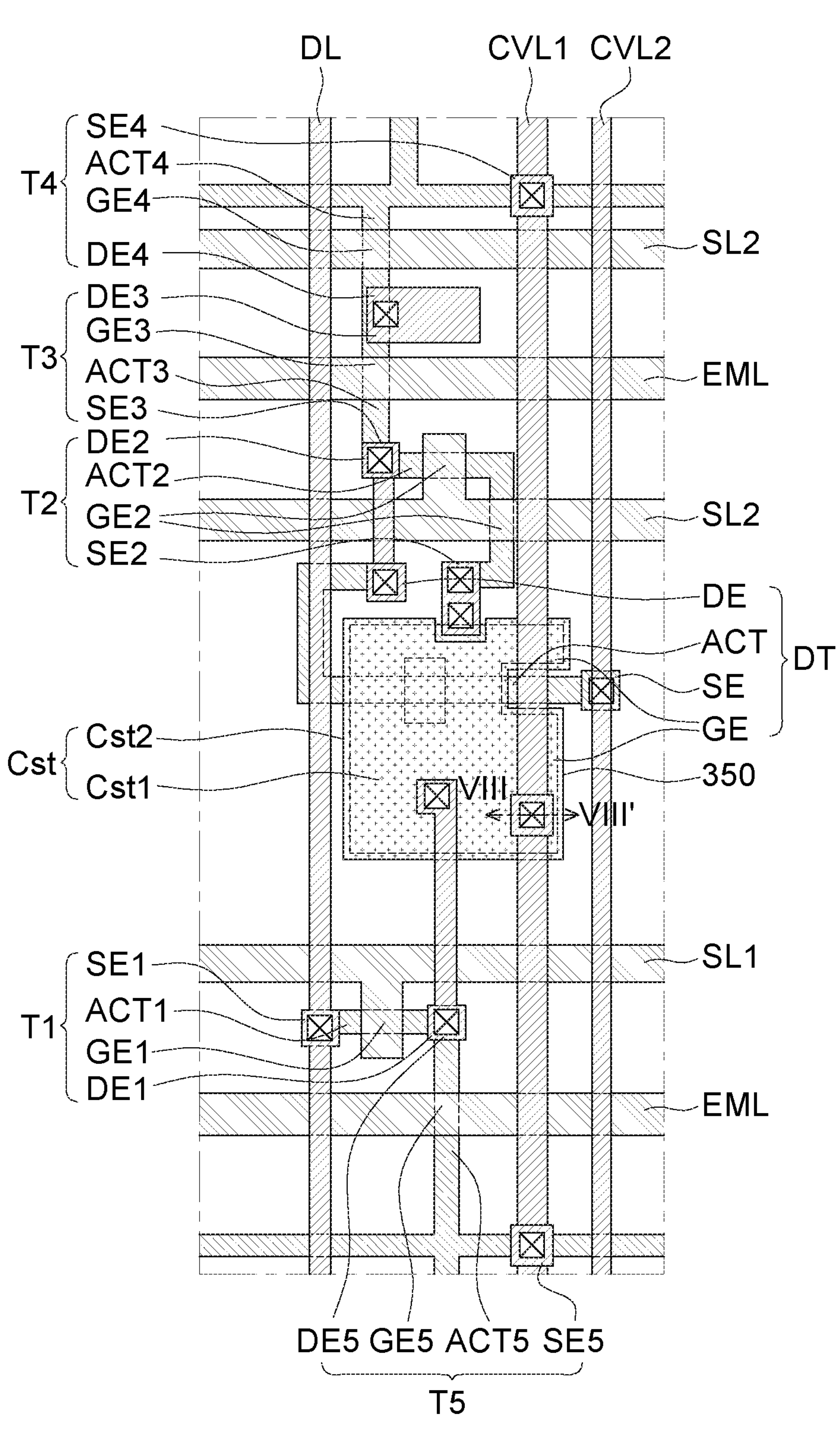
FIG. 9 is a top plan view of a display device according to still another embodiment of the present specification.
Figure 10:
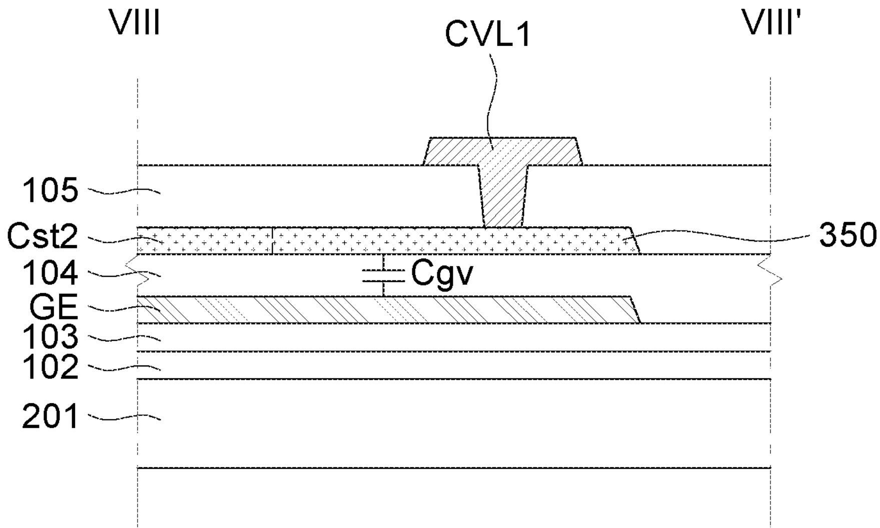
FIG. 10 is a cross-sectional view taken along line VIII-VIII' in FIG. 9 according to an embodiment of the present specification.

FIG. 9 is a top plan view of a display device according to still another embodiment of the present specification. FIG. 10 is a cross-sectional view taken along line VIII-VIII' in FIG. 9 according to an embodiment of the present specification. A display device 300 in FIGS. 9 and 10 is substantially identical in configuration to the display device 100 in FIGS. 1 to 7, except for a conductive pattern 350. Therefore, repeated descriptions of the identical components will be omitted.

With reference to FIGS. 9 and 10, the display device 300 further includes the conductive pattern 350 connected to one of the plurality of constant voltage lines CVL1 and CVL2 and configured to overlap the gate electrode GE of the driving transistor DT. For example, the conductive pattern 350 may be connected to the first constant voltage line CVL1 among the plurality of constant voltage lines.

The conductive pattern 350 may be disposed between the gate electrode GE of the driving transistor DT and the first constant voltage line CVL1. The conductive pattern 350 may be disposed between the first interlayer insulation layer 104 and a second interlayer insulation layer 150. The conductive pattern 350 may overlap the gate electrode GE of the driving transistor DT. The conductive pattern 350 may be disposed on the same layer as the second capacitor electrode Cst2 and integrated with the second capacitor electrode Cst2. However, the present specification is not limited thereto. For example, like the second capacitor electrode Cst2, the conductive pattern 350 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof.

The conductive pattern 350 may extend from the second capacitor electrode Cst2 in the direction of the first constant voltage line CVL1 and overlap the second portion of the gate electrode GE. In addition, the conductive pattern 350 may at least partially overlap the first constant voltage line CVL1 and be electrically connected to the first constant voltage line CVL1. For example, the conductive pattern 350 may be electrically connected to the first constant voltage line CVL1 through a contact hole formed in the second interlayer insulation layer 105. The first constant voltage line CVL1 may extend in the column direction in the subpixel and transmit the first constant voltage at a predetermined voltage level. For example, the first constant voltage line CVL1 may be a reference voltage line that transmits the reference voltage Vref to the subpixel. Therefore, the first constant voltage may be applied to the conductive pattern 350 electrically connected to the first constant voltage line CVL1 that provides the first constant voltage, and the auxiliary capacitor Cgv may be formed between the conductive pattern 350 and the gate electrode GE of the driving transistor DT.

In the display device 300 according to still another embodiment of the present specification, the gate electrode GE of the driving transistor DT and the first constant voltage line CVL1, which transmits the first constant voltage, e.g., the reference voltage Vref, are disposed to overlap each other, such that the auxiliary capacitor Cgv may be formed. Therefore, in the display device 300 according to still another embodiment of the present specification, a separate metal layer may be excluded, and a mask process of forming the metal layer may be excluded, such that the manufacturing costs may be reduced, and the manufacturing process may be optimized.

In the display device 300 according to still another embodiment of the present specification, the gate electrode GE of the driving transistor DT and the first constant voltage line CVL1, which transmits the first constant voltage, e.g., the reference voltage Vref, are disposed to overlap each other, such that the auxiliary capacitor Cgv may be formed. Therefore, in the display device 300 according to still another embodiment of the present specification, the auxiliary capacitor Cgv may be ensured even though a separate metal layer is excluded. A threshold voltage compensation error rate of the driving transistor DT and a luminance deviation of the display device 300 may be minimized or at least reduced, which may improve the display quality.

In the display device 300 according to still another embodiment of the present specification, the conductive pattern 350 is disposed between the gate electrode GE of the driving transistor DT and the first constant voltage line CVL1 to which a constant voltage is applied. The conductive pattern 350 is electrically connected to the first constant voltage line CVL1 and overlaps the gate electrode GE of the driving transistor DT. Therefore, the conductive pattern 350, which is electrically connected to the first constant voltage line CVL1, is disposed to be closer to the gate electrode GE of the driving transistor DT than the first constant voltage line CVL1, such that the auxiliary capacitor Cgv may be formed. Therefore, in the display device 300 according to still another embodiment of the present specification, a capacity of the auxiliary capacitor Cgv may increase, which may ensure a sufficient capacity of the auxiliary capacitor Cgv.

Figure 11:
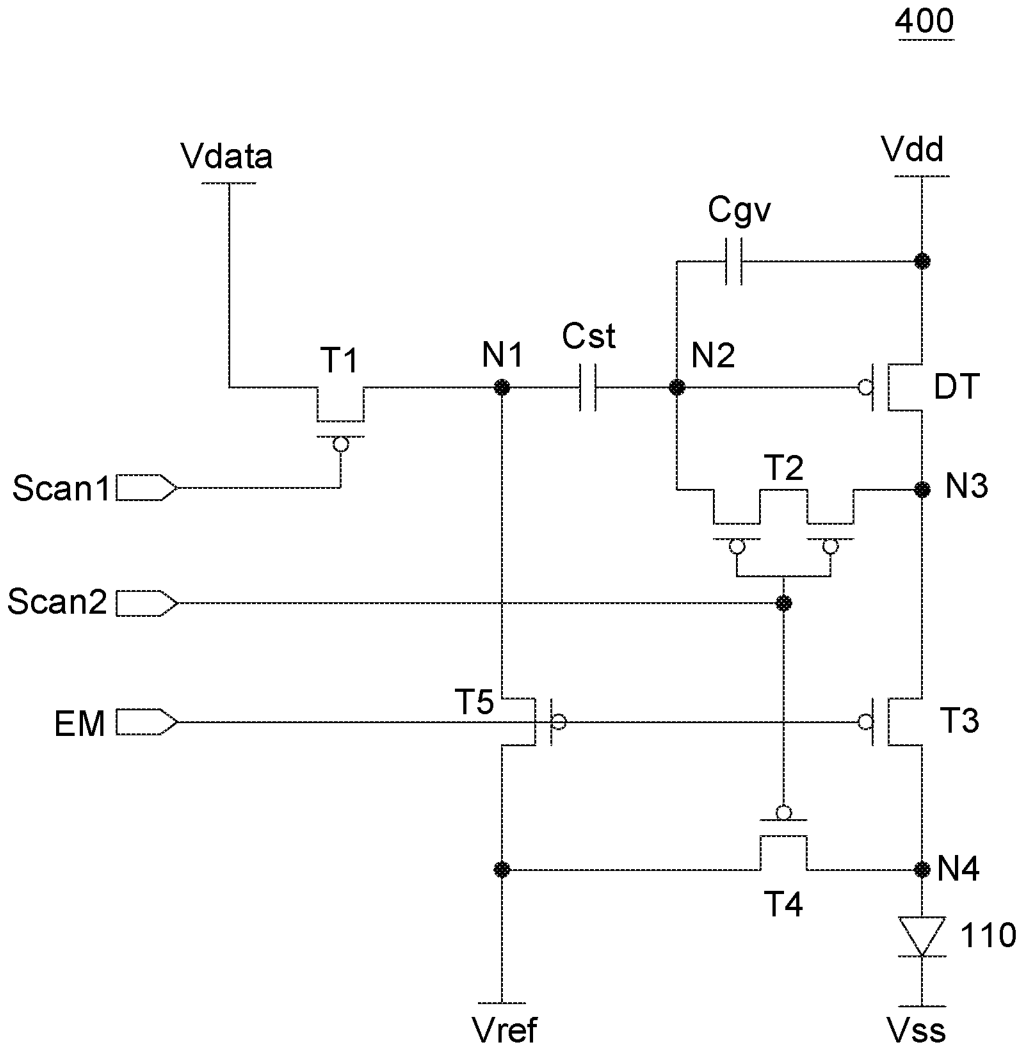
FIG. 11 is a view illustrating an example of a subpixel circuit of a display device according to yet another embodiment of the present specification.
Figure 12:
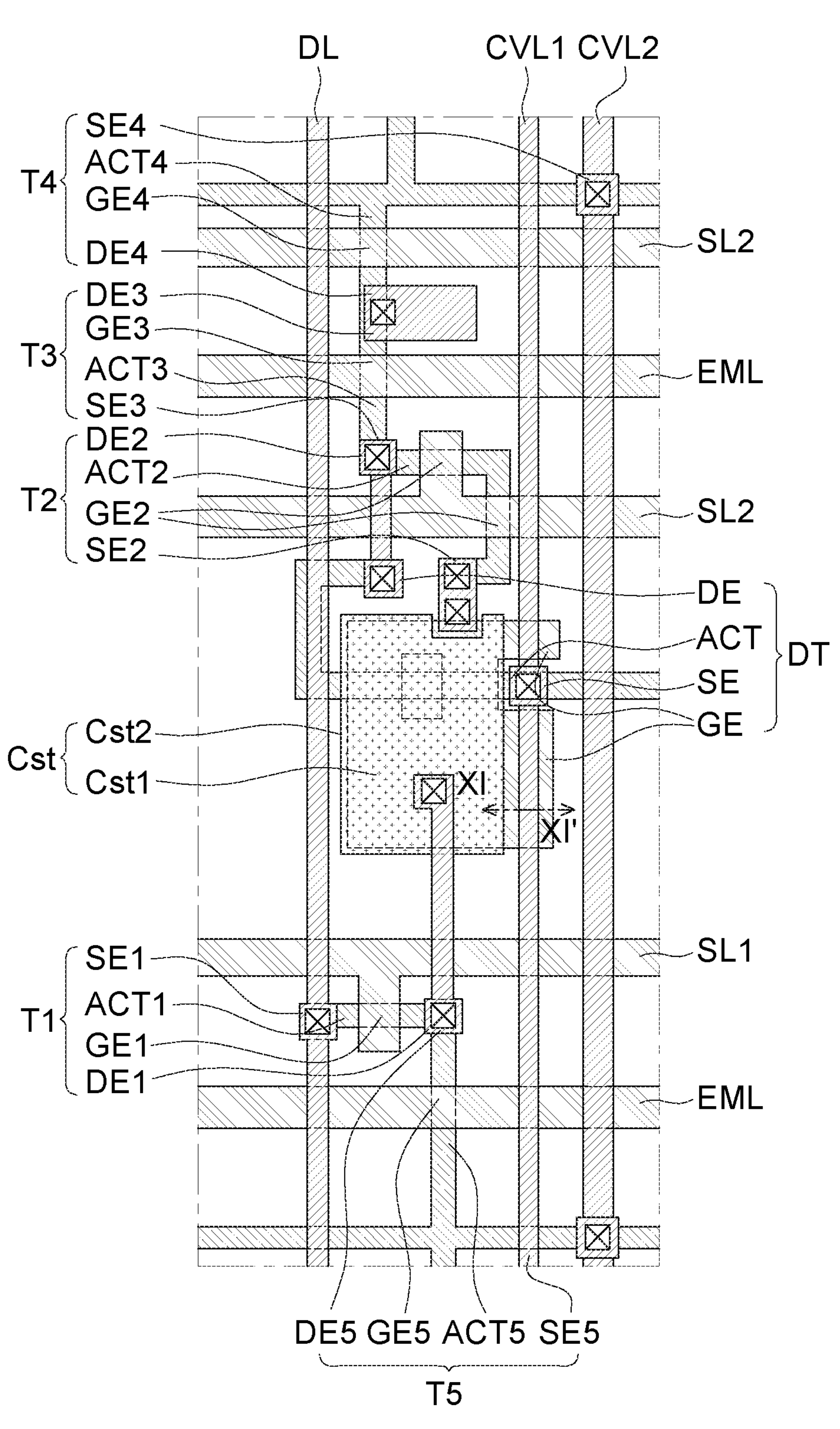
FIG. 12 is a top plan view of the display device according to yet another embodiment of the present specification.
Figure 13:
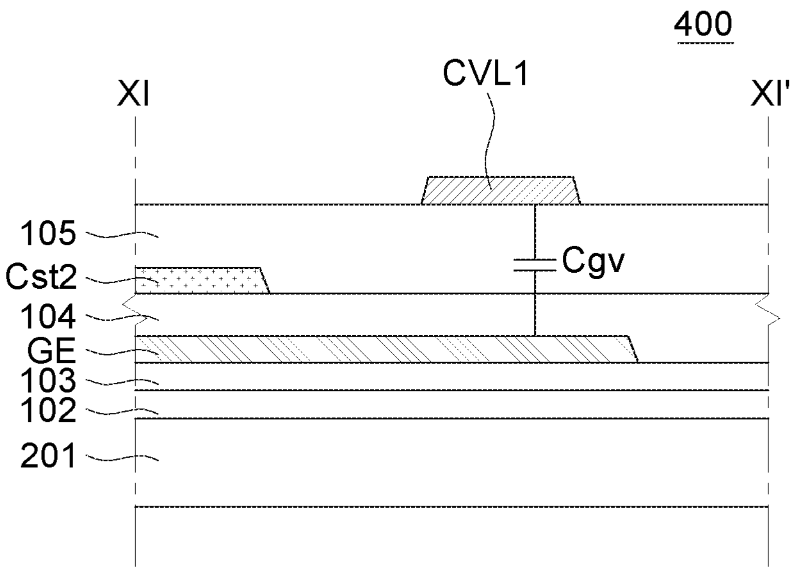
FIG. 13 is a cross-sectional view taken along line XI-XI' in FIG. 12 according to an embodiment of the present specification.

FIG. 11 is a view illustrating an example of a subpixel circuit of a display device according to yet another embodiment of the present specification. FIG. 12 is a top plan view of the display device according to yet another embodiment of the present specification. FIG. 13 is a cross-sectional view taken along line XI-XI' in FIG. 12 according to an embodiment of the present specification. A display device 400 in FIGS. 11 to 13 is substantially identical in configuration to the display device 200 in FIG. 8, except for the auxiliary capacitor Cgv, the first constant voltage line CVL1, and the second constant voltage line CVL2. Therefore, repeated descriptions of the identical components will be omitted.

With reference to FIG. 11, the auxiliary capacitor Cgv may be disposed between the first capacitor electrode of the storage capacitor Cst and the high-potential voltage line that supplies the high-potential voltage Vdd. The auxiliary capacitor Cgv may inhibit the voltage of the gate electrode of the driving transistor DT from being increased by a kick-back phenomenon.

With reference to FIGS. 12 and 13, the first constant voltage line CVL1 and the second constant voltage line CVL2 may be disposed in the subpixel and extend in the column direction.

The first constant voltage line CVL1 may extend in the column direction in the subpixel and transmit the first constant voltage at a predetermined voltage level. For example, the first constant voltage line CVL1 may be a high-potential voltage line that transmits the high-potential voltage Vdd to the subpixel. The first constant voltage line CVL1 may be electrically connected to the driving transistor DT and transmit the high-potential voltage Vdd to the driving transistor DT.

The second constant voltage line CVL2 may extend in the column direction in the subpixel and transmit the second constant voltage at a predetermined voltage level. For example, the second constant voltage line CVL2 may be a reference voltage line that transmits the reference voltage Vref to the subpixel. The second constant voltage line CVL2 may be electrically connected to the fourth transistor T4 and the fifth transistor T5 and transmit the reference voltage Vref to the fourth transistor T4 and the fifth transistor T5.

The gate electrode GE of the driving transistor DT may overlap the first constant voltage line CVL1. The gate electrode GE of the driving transistor DT may extend and at least partially overlap the first constant voltage line CVL1. For example, the gate electrode GE of the driving transistor DT may overlap the first constant voltage line CVL1 that provides the high-potential voltage Vdd that is a constant voltage. Therefore, the auxiliary capacitor Cgv may be formed between the first constant voltage line CVL1, which provides the first constant voltage, and the gate electrode GE of the driving transistor DT. For example, a first portion of the gate electrode GE of the driving transistor DT may overlap the active layer ACT of the driving transistor DT, and a second portion of the gate electrode GE of the driving transistor DT may extend from the first portion in the direction of the first constant voltage line CVL1. That is, the first portion of the gate electrode GE may overlap the active layer ACT, and the second portion, which extends from the first portion in the direction of the first constant voltage line CVL1, may overlap the first constant voltage line CVL1.

In the display device 400 according to yet another embodiment of the present specification, the gate electrode GE of the driving transistor DT and the first constant voltage line CVL1, which provides the first constant voltage, are disposed to overlap each other, such that the auxiliary capacitor Cgv may be formed. Therefore, in the display device 400 according to still another embodiment of the present specification, a separate metal layer may be excluded, and a mask process of forming the metal layer may be excluded, such that the manufacturing costs may be reduced, and the manufacturing process may be optimized.

In the display device 400 according to still another embodiment of the present specification, the gate electrode GE of the driving transistor DT and the first constant voltage line CVL1, which transmits the first constant voltage, e.g., the high-potential voltage Vdd, are disposed to overlap each other, such that the auxiliary capacitor Cgv may be formed. Therefore, in the display device 400 according to still another embodiment of the present specification, the auxiliary capacitor Cgv may be ensured even though a separate metal layer is excluded. A threshold voltage compensation error rate of the driving transistor DT and a luminance deviation of the display device 400 may be minimized or at least reduced, which may improve the display quality.

In the display device 400 according to yet another embodiment of the present specification, the gate electrode GE of the driving transistor DT may overlap the first constant voltage line CVL1 to which the high-potential voltage Vdd, which has a higher voltage level than the reference voltage Vref, is applied, such that the auxiliary capacitor Cgv may be formed. Therefore, in the display device 400 according to yet another embodiment of the present specification, the capacity of the capacitor Cgv may be increased, and the fluctuation of the voltage value of the gate electrode of the driving transistor may be reduced.

Figure 14:
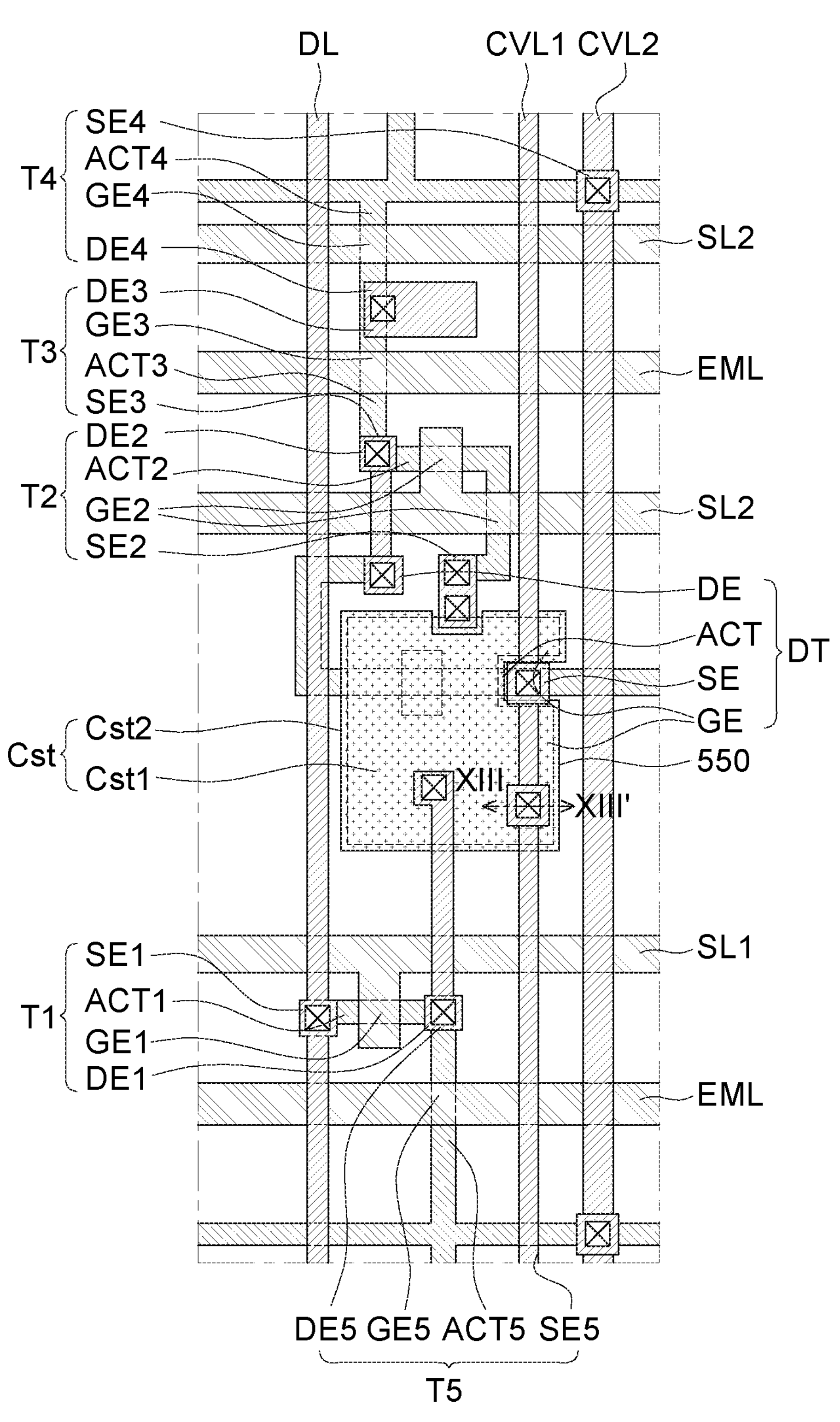
FIG. 14 is a top plan view of a display device according to still yet another embodiment of the present specification.
Figure 15:
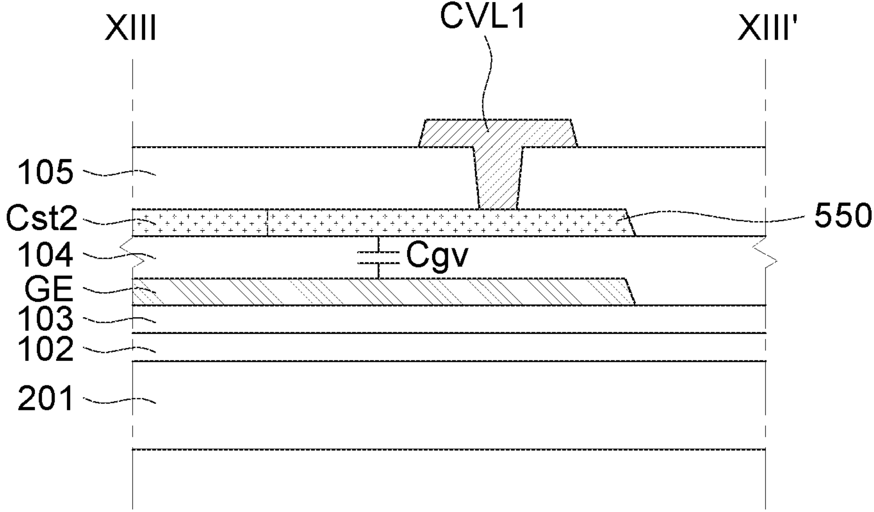
FIG. 15 is a cross-sectional view taken along line XIII-XIII' in FIG. 14 according to an embodiment of the present specification.

FIG. 14 is a top plan view of a display device according to still another embodiment of the present specification. FIG. 15 is a cross-sectional view taken along line XIII-XIII' in FIG. 14 according to an embodiment of the present specification. A display device 500 in FIGS. 14 and 15 is substantially identical in configuration to the display device 400 in FIGS. 11 to 13, except for a conductive pattern 550. Therefore, repeated descriptions of the identical components will be omitted.

With reference to FIGS. 14 and 15, the display device 500 further includes the conductive pattern 550 connected to one of the plurality of constant voltage lines CVL1 and CVL2 and configured to overlap the gate electrode GE of the driving transistor DT. For example, the conductive pattern 550 may be connected to the first constant voltage line CVL1 among the plurality of constant voltage lines.

The conductive pattern 550 may be disposed between the gate electrode GE of the driving transistor DT and the first constant voltage line CVL1. The conductive pattern 550 may be disposed between the first interlayer insulation layer 104 and the second interlayer insulation layer 150. The conductive pattern 550 may overlap the gate electrode GE of the driving transistor DT. The conductive pattern 550 may be disposed on the same layer as the second capacitor electrode Cst2 and integrated with the second capacitor electrode Cst2. However, the present specification is not limited thereto. For example, like the second capacitor electrode Cst2, the conductive pattern 550 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. For example, the conductive pattern 550 may extend from the second capacitor electrode Cst2 in the direction of the first constant voltage line CVL1 and overlap the second portion of the gate electrode GE. In addition, the conductive pattern 550 may at least partially overlap the first constant voltage line CVL1 and be electrically connected to the first constant voltage line CVL1. For example, the conductive pattern 550 may be electrically connected to the first constant voltage line CVL1 through a contact hole formed in the second interlayer insulation layer 105. The first constant voltage line CVL1 may extend in the column direction in the subpixel and transmit the first constant voltage at a predetermined voltage level. For example, the first constant voltage line CVL1 may be a high-potential voltage line that transmits the high-potential voltage Vdd to the subpixel. Therefore, the first constant voltage may be applied to the conductive pattern 550 electrically connected to the first constant voltage line CVL1 that provides the first constant voltage, and the auxiliary capacitor Cgv may be formed between the conductive pattern 550 and the gate electrode GE of the driving transistor DT.

In the display device 500 according to still yet another embodiment of the present specification, the gate electrode GE of the driving transistor DT and the first constant voltage line CVL1, which provides the first constant voltage, are disposed to overlap each other, such that the auxiliary capacitor Cgv may be formed. Therefore, in the display device 500 according to still yet another embodiment of the present specification, a separate metal layer may be excluded, and a mask process of forming the metal layer may be excluded, such that the manufacturing costs may be reduced, and the manufacturing process may be optimized.

In the display device 500 according to still another embodiment of the present specification, the gate electrode GE of the driving transistor DT and the first constant voltage line CVL1, which transmits the first constant voltage, e.g., the high-potential voltage Vdd, are disposed to overlap each other, such that the auxiliary capacitor Cgv may be formed. Therefore, in the display device 500 according to still another embodiment of the present specification, the auxiliary capacitor Cgv may be ensured even though a separate metal layer is excluded. A threshold voltage compensation error rate of the driving transistor DT and a luminance deviation of the display device 500 may be minimized or at least reduced, which may improve the display quality.

In the display device 500 according to still another embodiment of the present specification, the conductive pattern 550 is disposed between the gate electrode GE of the driving transistor DT and the first constant voltage line CVL1 to which a constant voltage is applied. The conductive pattern 550 is electrically connected to the first constant voltage line CVL1 and overlaps the gate electrode GE of the driving transistor DT. Therefore, the conductive pattern 550, which is electrically connected to the first constant voltage line CVL1, is disposed to be closer to the gate electrode GE of the driving transistor DT than the first constant voltage line CVL1, such that the auxiliary capacitor Cgv may be formed. Therefore, in the display device 500 according to still another embodiment of the present specification, a capacity of the auxiliary capacitor Cgv may increase, which may ensure a sufficient capacity of the auxiliary capacitor Cgv.

In the display device 500 according to yet another embodiment of the present specification, the gate electrode GE of the driving transistor DT may overlap the first constant voltage line CVL1 to which the high-potential voltage Vdd, which has a higher voltage level than the reference voltage Vref, is applied, such that the auxiliary capacitor Cgv may be formed. Therefore, in the display device 500 according to still yet another embodiment of the present specification, the capacity of the auxiliary capacitor Cgv may be increased, and the fluctuation of the voltage value of the gate electrode of the driving transistor may be reduced.

Figure 16:
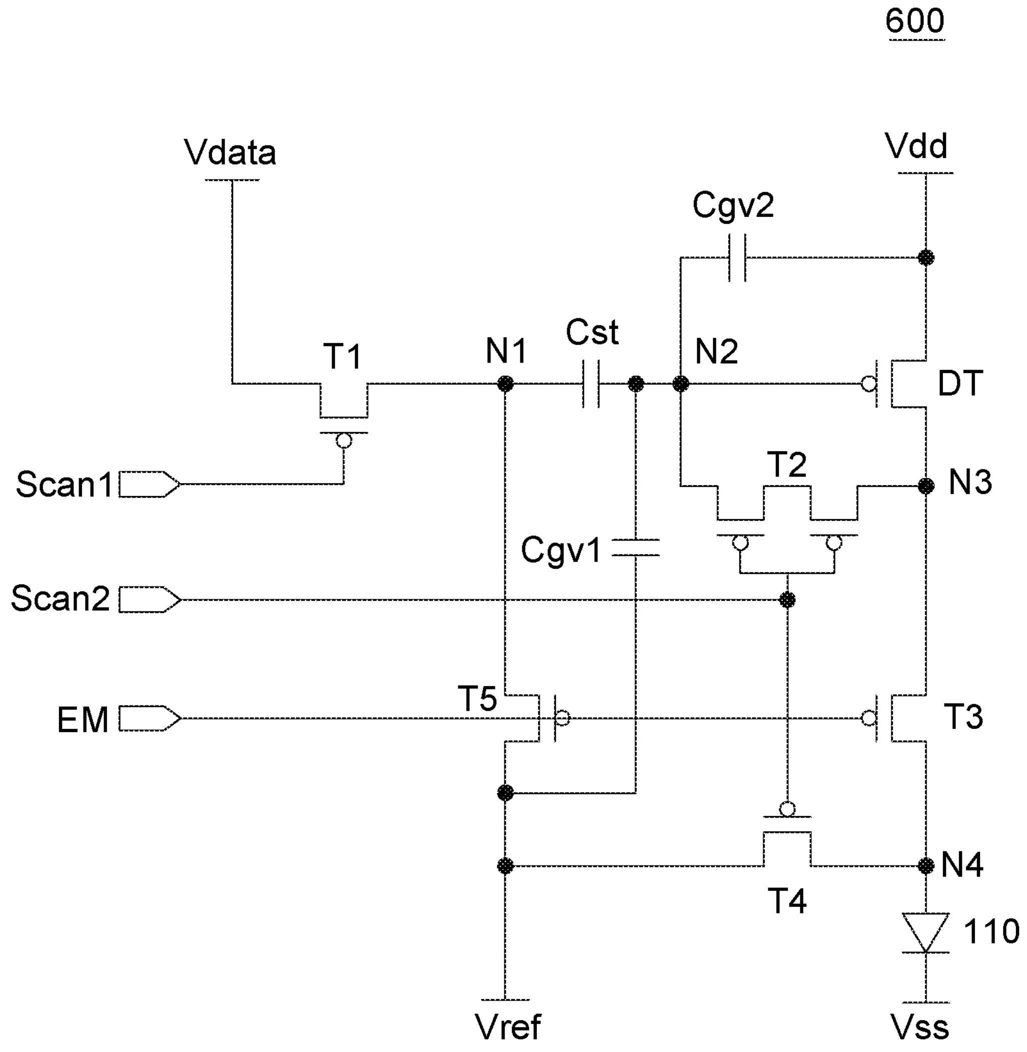
FIG. 16 is a view illustrating an example of a subpixel circuit of a display device according to a further embodiment of the present specification.
Figure 17:
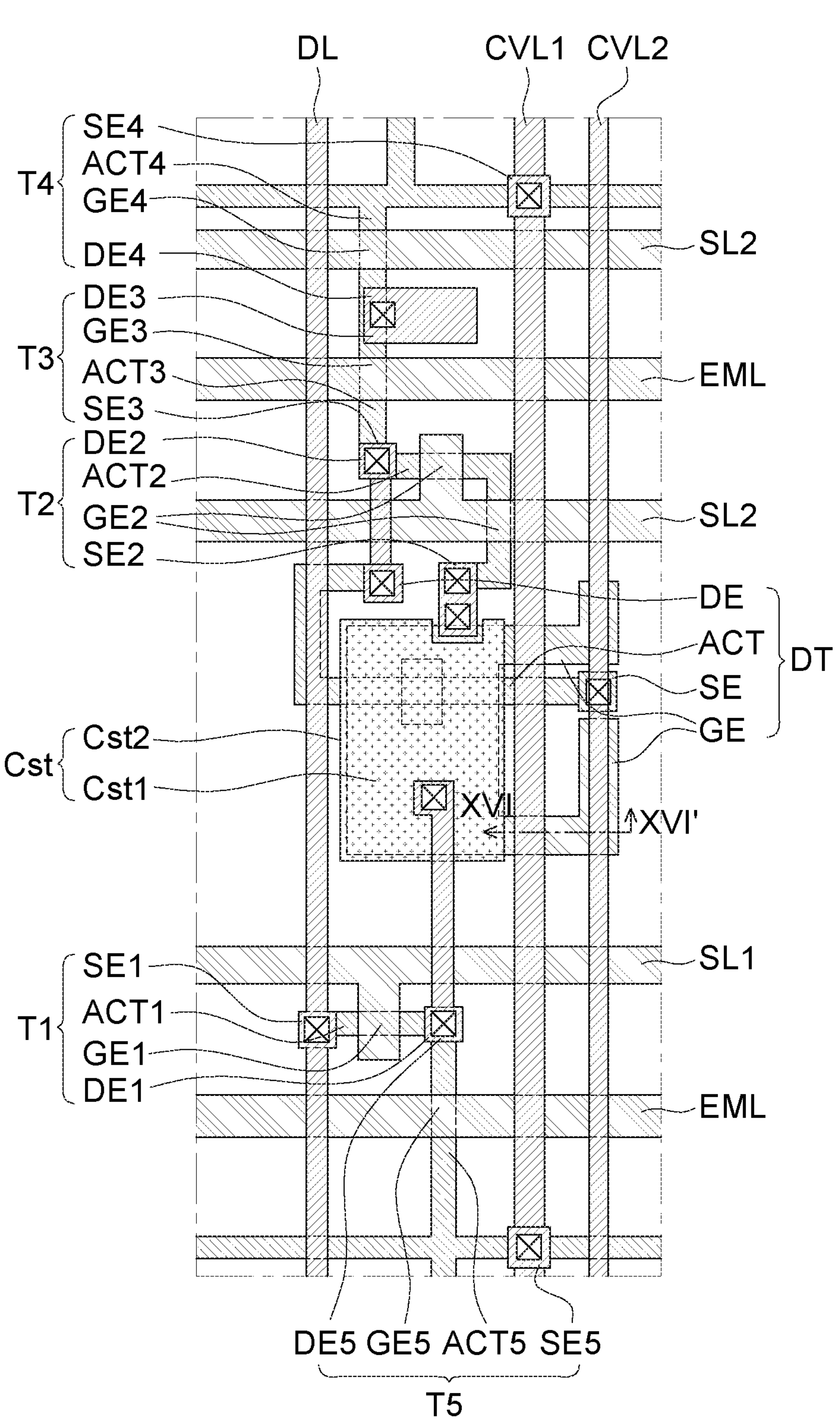
FIG. 17 is a top plan view of the display device according to the further embodiment of the present specification.
Figure 18:
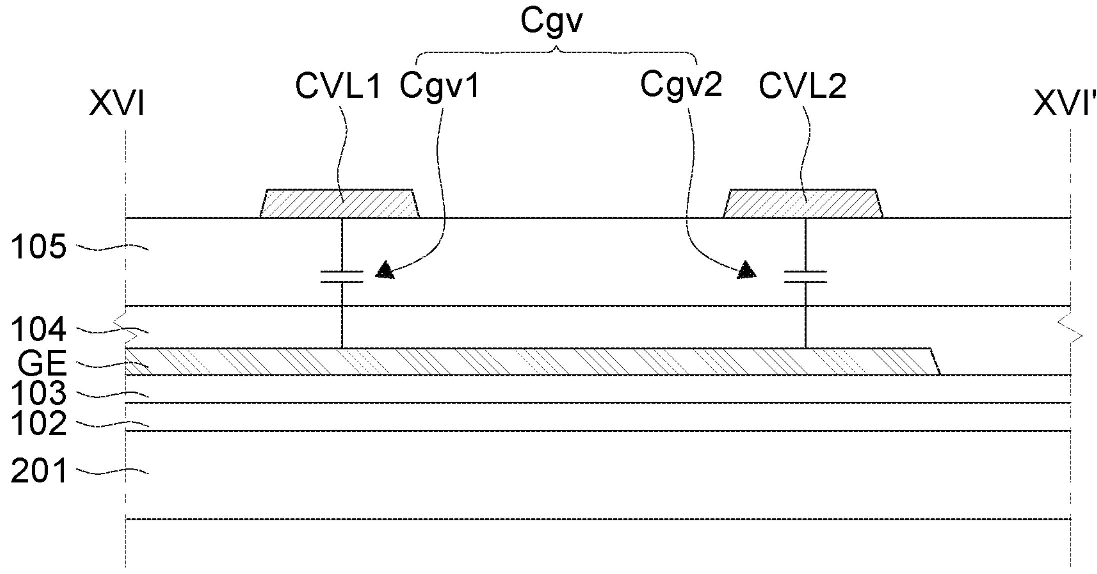
FIG. 18 is a cross-sectional view taken along line XVI-XVI' in FIG. 17 according to an embodiment of the present specification.

FIG. 16 is a view illustrating an example of a subpixel circuit of a display device according to a further embodiment of the present specification. FIG. 17 is a top plan view of the display device according to the further embodiment of the present specification. FIG. 18 is a cross-sectional view taken along line XVI-XVI' in FIG. 17 according to an embodiment of the present specification. A display device 600 in FIGS. 16 to 18 is substantially identical in configuration to the display device 400 in FIGS. 11 to 13, except for the first constant voltage line CVL1 and the second constant voltage line CVL2. Therefore, repeated descriptions of the identical components will be omitted.

With reference to FIG. 16, the auxiliary capacitor Cgv may include a first auxiliary capacitor Cgv1 and a second auxiliary capacitor Cgv2. The first auxiliary capacitor Cgv1 may be formed between the first capacitor electrode of the storage capacitor Cst and the high-potential voltage line that supplies the high-potential voltage Vdd. The second auxiliary capacitor Cgv2 may be formed between the first capacitor electrode of the storage capacitor Cst and the high-potential voltage line that supplies the high-potential voltage Vdd. The first auxiliary capacitor Cgv1 and the second auxiliary capacitor Cgv2 may inhibit the voltage of the gate electrode of the driving transistor DT from being increased by a kick-back phenomenon.

With reference to FIGS. 17 and 18, the first constant voltage line CVL1 and the second constant voltage line CVL2 may be disposed in the subpixel and extend in the column direction.

The first constant voltage line CVL1 may extend in the column direction in the subpixel and transmit the first constant voltage at a predetermined voltage level. For example, the first constant voltage line CVL1 may be a reference voltage line that transmits the reference voltage Vref to the subpixel. The first constant voltage line CVL1 may be electrically connected to the fourth transistor T4 and the fifth transistor T5 and transmit the reference voltage Vref to the fourth transistor T4 and the fifth transistor T5.

The second constant voltage line CVL2 may extend in the column direction in the subpixel and transmit the second constant voltage at a predetermined voltage level. For example, the second constant voltage line CVL2 may be a high-potential voltage line that transmits the high-potential voltage Vdd to the subpixel. The second constant voltage line CVL2 may be electrically connected to the driving transistor DT and transmit the high-potential voltage Vdd to the driving transistor DT.

The gate electrode GE of the driving transistor DT may overlap the first constant voltage line CVL1 and the second constant voltage line CVL2. The gate electrode GE of the driving transistor DT may extend and at least partially overlap the first constant voltage line CVL1 and the second constant voltage line CVL2. For example, the gate electrode GE of the driving transistor DT may overlap the first constant voltage line CVL1, which provides the reference voltage Vref that is a constant voltage, and overlap the second constant voltage line CVL2 that provides the high-potential voltage Vdd that is a constant voltage. Therefore, the first auxiliary capacitor Cgv1 and the second auxiliary capacitor Cgv2 may be formed between the first constant voltage line CVL1, which provides the first constant voltage, the second constant voltage line CVL2, which provides the second constant voltage, and the gate electrode GE of the driving transistor DT. For example, the first portion of the gate electrode GE of the driving transistor DT may overlap the active layer ACT of the driving transistor DT, and the second portion of the gate electrode GE of the driving transistor DT may extend from the first portion in the direction of the second constant voltage line CVL2. That is, the first portion of the gate electrode GE may overlap the active layer ACT, and the second portion, which extends from the first portion in the direction of the second constant voltage line CVL2, may overlap the first constant voltage line CVL1 and the second constant voltage line CVL2, such that the first auxiliary capacitor Cgv1 and the second auxiliary capacitor Cgv2 may be formed.

In the display device 600 according to the further embodiment of the present specification, the gate electrode GE of the driving transistor DT, the first constant voltage line CVL1, which provides the first constant voltage, and the second constant voltage line CVL2, which provides the second constant voltage, are disposed to overlap one another, such that the auxiliary capacitor Cgv may be formed. Therefore, in the display device 600 according to the further embodiment of the present specification, a separate metal layer may be excluded, and a mask process of forming the metal layer may be excluded, such that the manufacturing costs may be reduced, and the manufacturing process may be optimized.

In the display device 600 according to the further embodiment of the present specification, the gate electrode GE of the driving transistor DT, the first constant voltage line CVL1, which transmits the first constant voltage, e.g., the reference voltage Vref, and the second constant voltage line CVL2, which transmits the second constant voltage, e.g., the high-potential voltage Vdd, are disposed to overlap one another, such that the auxiliary capacitor Cgv may be formed. Therefore, in the display device 600 according to the further embodiment of the present specification, the auxiliary capacitor Cgv may be ensured even though a separate metal layer is excluded. A threshold voltage compensation error rate of the driving transistor DT and a luminance deviation of the display device 600 may be minimized, which may improve the display quality.

In the display device 600 according to the further embodiment of the present specification, the gate electrode GE of the driving transistor DT, the first constant voltage line CVL1, which provides the first constant voltage, and the second constant voltage line CVL2, which provides the second constant voltage, are disposed to overlap one another, such that the first auxiliary capacitor Cgv1 and the second auxiliary capacitor Cgv2 may be formed. Therefore, in the display device 600 according to the further embodiment of the present specification, it is possible to increase the capacity of the auxiliary capacitor Cgv and ensure the sufficient capacity of the auxiliary capacitor Cgv in comparison with a case in which the gate electrode GE of the driving transistor DT overlaps only one of the first constant voltage line CVL1 and the second constant voltage line CVL2.

Figure 19:
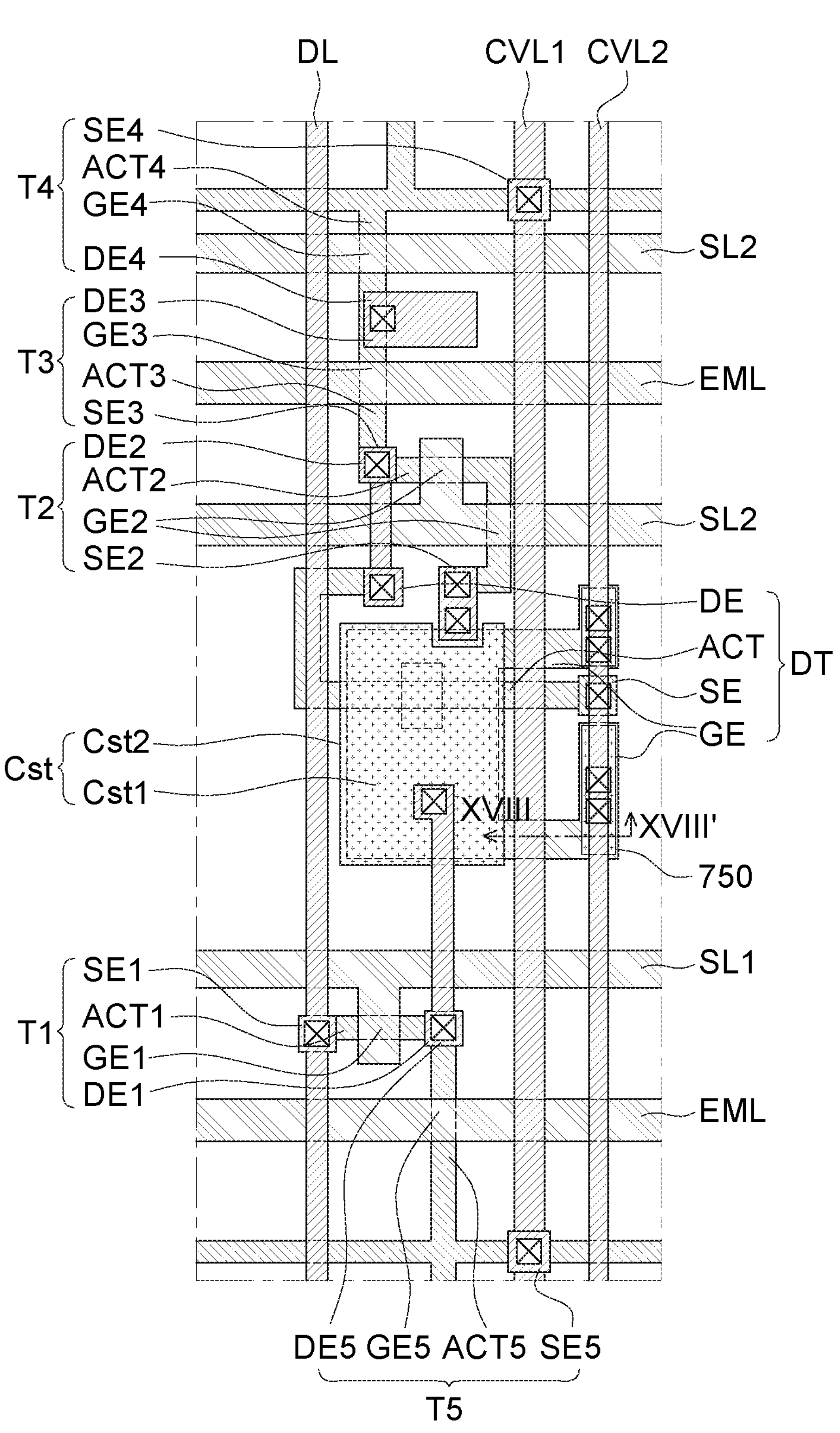
FIG. 19 is a top plan view of a display device according to another further embodiment of the present specification.
Figure 20:
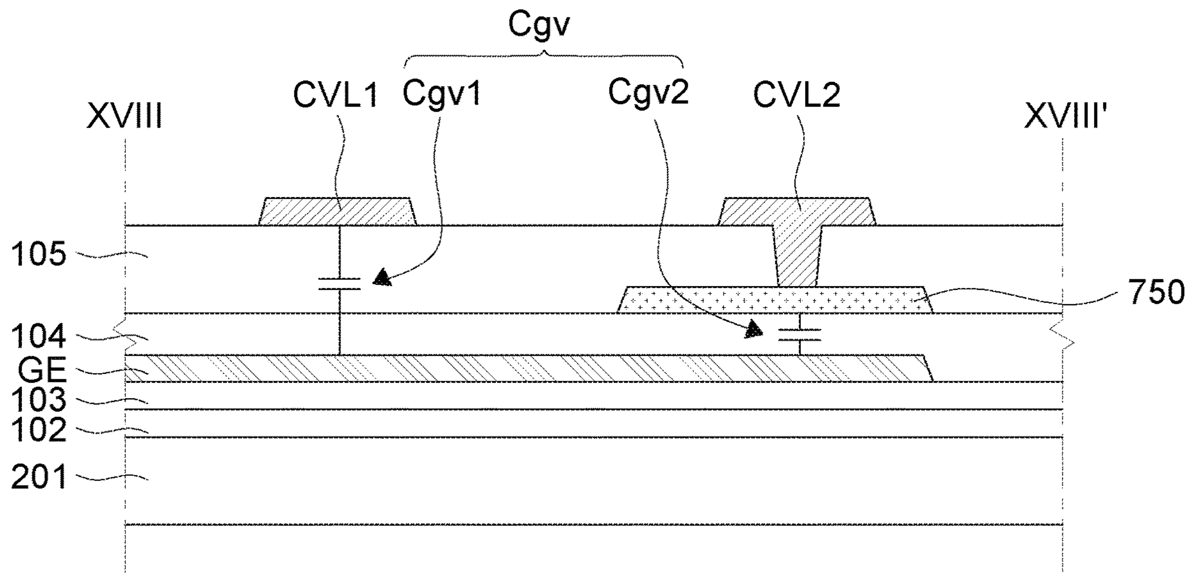
FIG. 20 is a cross-sectional view taken along line XVIII-XVIII' in FIG. 19 according to an embodiment of the present specification.

FIG. 19 is a top plan view of a display device according to another further embodiment of the present specification. FIG. 20 is a cross-sectional view taken along line XVIII-XVIII' in FIG. 19 according to an embodiment of the present specification. A display device 700 in FIGS. 19 and 20 is substantially identical in configuration to the display device 600 in FIGS. 16 to 18, except for a conductive pattern 750. Therefore, repeated descriptions of the identical components will be omitted.

With reference to FIGS. 19 and 20, the display device 700 further includes the conductive pattern 750 connected to one of the plurality of constant voltage lines CVL1 and CVL2 and configured to overlap the gate electrode GE of the driving transistor DT. For example, the conductive pattern 750 may be connected to the second constant voltage line CVL2 among the plurality of constant voltage lines.

The conductive pattern 750 may be disposed between the gate electrode GE of the driving transistor DT and the second constant voltage line CVL2. The conductive pattern 750 may be disposed between the first interlayer insulation layer 104 and the second interlayer insulation layer 150. The conductive pattern 750 may overlap the gate electrode GE of the driving transistor DT. The conductive pattern 750 may be disposed on the same layer as the second capacitor electrode Cst2. For example, like the second capacitor electrode Cst2, the conductive pattern 750 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof. For example, the conductive pattern 750 may overlap the second portion of the gate electrode GE. In addition, the conductive pattern 750 may overlap the second constant voltage line CVL2 and be electrically connected to the second constant voltage line CVL2. For example, the conductive pattern 750 may be electrically connected to the second constant voltage line CVL2 through a contact hole formed in the second interlayer insulation layer 105. The second constant voltage line CVL2 may extend in the column direction in the subpixel and transmit the second constant voltage at a predetermined voltage level. For example, the second constant voltage line CVL2 may be a high-potential voltage line that transmits the high-potential voltage Vdd to the subpixel. Therefore, the second constant voltage may be applied to the conductive pattern 750 electrically connected to the second constant voltage line CVL2 that provides the second constant voltage, and the auxiliary capacitor Cgv may be formed between the conductive pattern 750 and the gate electrode GE of the driving transistor DT. That is, the second portion of the gate electrode GE may overlap the first constant voltage line CVL1, such that the first auxiliary capacitor Cgv1 may be formed. The second portion of the gate electrode GE may CVL2, such that the second auxiliary capacitor Cgv2 may be formed.

In the display device 700 according to another further embodiment of the present specification, the gate electrode GE of the driving transistor DT, the first constant voltage line CVL1, which provides the first constant voltage, and the second constant voltage line CVL2, which provides the second constant voltage, are disposed to overlap one another, such that the auxiliary capacitor Cgv may be formed. Therefore, in the display device 700 according to another further embodiment of the present specification, a separate metal layer may be excluded, and a mask process of forming the metal layer may be excluded, such that the manufacturing costs may be reduced, and the manufacturing process may be optimized.

In the display device 700 according to another further embodiment of the present specification, the gate electrode GE of the driving transistor DT, the first constant voltage line CVL1, which transmits the first constant voltage, e.g., the reference voltage Vref, and the second constant voltage line CVL2, which transmits the second constant voltage, e.g., the high-potential voltage Vdd, are disposed to overlap one another, such that the auxiliary capacitor Cgv may be formed. Therefore, in the display device 700 according to another further embodiment of the present specification, the auxiliary capacitor Cgv may be ensured even though a separate metal layer is excluded. A threshold voltage compensation error rate of the driving transistor DT and a luminance deviation of the display device 100 may be minimized or at least reduced, which may improve the display quality.

In the display device 700 according to another further embodiment of the present specification, the gate electrode GE of the driving transistor DT may overlap the first constant voltage line CVL1, which provides the first constant voltage, such that the first auxiliary capacitor Cgv1 may be formed, and the gate electrode GE of the driving transistor DT may CVL2, such that the second auxiliary capacitor Cgv2 may be formed. Therefore, it is possible to increase the capacity of the auxiliary capacitor Cgv and ensure the sufficient capacity of the auxiliary capacitor Cgv in comparison with a case in which the gate electrode GE of the driving transistor DT overlaps only one of the first constant voltage line CVL1 and the second constant voltage line CVL2.

In the display device 700 according to the further embodiment of the present specification, the conductive pattern 750 is disposed between the gate electrode GE of the driving transistor DT and the second constant voltage line CVL2 to which a constant voltage is applied. The conductive pattern 750 is electrically connected to the second constant voltage line CVL2 and overlaps the gate electrode GE of the driving transistor DT. Therefore, the conductive pattern 750, which is electrically connected to the second constant voltage line CVL2, is disposed to be closer to the gate electrode GE of the driving transistor DT than the second constant voltage line CVL2, such that the second auxiliary capacitor Cgv2 may be formed. Therefore, in the display device 700 according to the further embodiment of the present specification, a capacity of the auxiliary capacitor Cgv may increase, which may ensure a sufficient capacity of the auxiliary capacitor Cgv.

In the display device 700 according to another further embodiment of the present specification, the gate electrode GE of the driving transistor DT may overlap the conductive pattern 750 electrically connected to the second constant voltage line CVL2, to which the high-potential voltage Vdd, which has a higher voltage level than the reference voltage Vref, is applied, such that the second auxiliary capacitor Cgv2 may be formed. Therefore, in the display device 700 according to another further embodiment of the present specification, the capacity of the auxiliary capacitor Cgv may be increased, and the fluctuation of the voltage value of the gate electrode of the driving transistor may be reduced.

A display device according to the exemplary embodiments of the present disclosure can also be described as follows:

A display device according to an exemplary embodiment of the present disclosure includes a plurality of subpixels, a plurality of subpixel circuits disposed in the plurality of subpixels and comprising a driving transistor and a plurality of constant voltage lines connected to the plurality of subpixel circuits, wherein a gate electrode of the driving transistor overlaps at least one of the plurality of constant voltage lines.

The plurality of constant voltage lines may include a first constant voltage line to which a first constant voltage is applied, and the gate electrode of the driving transistor may overlap the first constant voltage line.

The first constant voltage may be one of a reference voltage and a high-potential power voltage.

The plurality of constant voltage lines may further include a second constant voltage line to which a second constant voltage is applied, and the gate electrode of the driving transistor overlaps the first constant voltage line and the second constant voltage line.

One of a reference voltage and a high-potential power voltage may be the first constant voltage, and the other of the reference voltage and the high-potential power voltage may be the second constant voltage.

The display device may further include a substrate, a gate insulation layer disposed between an active layer of the driving transistor and the gate electrode of the driving transistor and an interlayer insulation layer disposed between the gate electrode of the driving transistor and a source electrode and a drain electrode of the driving transistor, wherein at least one of the plurality of constant voltage lines is disposed on the interlayer insulation layer and overlaps the gate electrode of the driving transistor.

The substrate may include a first plastic substrate, a second plastic substrate and an inorganic layer disposed between the first plastic substrate and the second plastic substrate. The substrate may be made of glass.

The gate electrode of the driving transistor may include a first portion configured to overlap the active layer of the driving transistor and a second portion extending from the first portion and configured to overlap at least one of the plurality of constant voltage lines.

The display device may further include a conductive pattern connected to at least one of the plurality of constant voltage lines and configured to overlap the gate electrode of the driving transistor.

The plurality of subpixel circuits may include the driving transistor configured to control a drive current to be applied to a light-emitting element, a first transistor configured to provide a data voltage to a first node in response to a first scan signal, a second transistor configured to provide a voltage of a second node to a third node in response to a second scan signal, a third transistor configured to provide a voltage of the third node to the fourth node in response to a light emission signal, a fourth transistor configured to provide a reference voltage to the fourth node in response to the second scan signal and a fifth transistor configured to provide the reference voltage to the first node in response to the light emission signal.

Each of the plurality of subpixel circuits may further comprise a storage capacitor, and wherein the gate electrode of the driving transistor and the at least one of the plurality of constant voltage lines may form an auxiliary capacitor.

A display device according to another exemplary embodiment of the present disclosure includes a substrate on which a plurality of subpixels is defined, a driving transistor disposed in each of the plurality of subpixels on the substrate, a first constant voltage line connected to the plurality of subpixels and to which a first constant voltage is applied and a second constant voltage line connected to the plurality of subpixels and to which a second constant voltage is applied, wherein a gate electrode of the driving transistor overlaps at least one of the first constant voltage line and the second constant voltage line.

The substrate may include a first organic layer, a second organic layer on the first organic layer and an inorganic layer between the first organic layer and the second organic layer.

The substrate may be made of glass.

The first constant voltage may be one of a reference voltage and a high-potential voltage, and the second constant voltage may be the other of the reference voltage and the high-potential voltage.

The gate electrode of the driving transistor may overlap the first constant voltage line and the second constant voltage line.

The display device may further include a conductive pattern configured to overlap at least one of the first constant voltage line and the second constant voltage line, wherein the conductive pattern overlaps the gate electrode of the driving transistor.

The conductive pattern may be electrically connected to at least one of the first constant voltage line and the second constant voltage line.

A display device according to another exemplary embodiment of the present disclosure includes: a plurality of subpixels; a plurality of subpixel circuits disposed in the plurality of subpixels respectively, wherein each of plurality of subpixel circuits comprises: a driving transistor; a storage capacitor connected to the driving transistor; and at least one auxiliary capacitor disposed between the storage capacitor and a reference voltage line or a high-potential voltage line.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:

a plurality of subpixels;

a plurality of subpixel circuits in the plurality of subpixels, each of the plurality of subpixel circuits comprising a driving transistor; and a plurality of constant voltage lines connected to the plurality of subpixel circuits, wherein a gate electrode of the driving transistor overlaps at least one of the plurality of constant voltage lines, wherein the plurality of constant voltage lines comprise a first constant voltage line to which a first constant voltage is applied, and a second constant voltage line to which a second constant voltage is applied, and wherein the gate electrode of the driving transistor overlaps the first constant voltage line and the second constant voltage line.

2. The display device of claim 1, wherein the first constant voltage is one of a reference voltage or a high-potential power voltage.

3. The display device of claim 1, wherein one of a reference voltage or a high-potential power voltage is the first constant voltage, and the other of the reference voltage and the high-potential power voltage is the second constant voltage.

4. The display device of claim 1, further comprising:

a substrate;

a gate insulation layer between an active layer of the driving transistor and the gate electrode of the driving transistor; and an interlayer insulation layer between the gate electrode of the driving transistor and a source electrode and a drain electrode of the driving transistor, wherein at least one of the plurality of constant voltage lines is on the interlayer insulation layer and overlaps the gate electrode of the driving transistor.

5. The display device of claim 4, wherein the substrate comprises:

a first plastic substrate;

a second plastic substrate; and an inorganic layer between the first plastic substrate and the second plastic substrate.

6. The display device of claim 4, wherein the substrate comprises glass.

7. The display device of claim 4, wherein the gate electrode of the driving transistor comprises:

a first portion overlapping the active layer of the driving transistor; and a second portion extending from the first portion and overlapping at least one of the plurality of constant voltage lines.

8. The display device of claim 1, wherein the plurality of subpixel circuits comprises:

the driving transistor configured to control a drive current to be applied to a light-emitting element;

a first transistor configured to provide a data voltage to a first node in response to a first scan signal;

a second transistor configured to provide a voltage of a second node to a third node in response to a second scan signal;

a third transistor configured to provide a voltage of the third node to a fourth node in response to a light emission signal;

a fourth transistor configured to provide a reference voltage to the fourth node in response to the second scan signal; and a fifth transistor configured to provide the reference voltage to the first node in response to the light emission signal.

9. The display device of claim 1, wherein each of the plurality of subpixel circuits further comprises a storage capacitor, and wherein the gate electrode of the driving transistor and the at least one of the plurality of constant voltage lines forms an auxiliary capacitor.

10. A display device comprising:

a substrate on which a plurality of subpixels are defined;

a driving transistor in each of the plurality of subpixels on the substrate;

a first constant voltage line connected to the plurality of subpixels and to which a first constant voltage is applied; and a second constant voltage line connected to the plurality of subpixels and to which a second constant voltage is applied, wherein a gate electrode of the driving transistor overlaps the first constant voltage line and the second constant voltage line.

11. The display device of claim 10, wherein the substrate comprises:

a first organic layer;

a second organic layer on the first organic layer; and an inorganic layer between the first organic layer and the second organic layer.

12. The display device of claim 10, wherein the substrate comprises glass.

13. The display device of claim 10, wherein the first constant voltage is one of a reference voltage or a high-potential voltage, and the second constant voltage is the other of the reference voltage and the high-potential voltage.

14. A display device comprising:

a plurality of subpixels;

a plurality of subpixel circuits disposed in the plurality of subpixels respectively, wherein each of plurality of subpixel circuits comprises:

a driving transistor;

a storage capacitor connected to the driving transistor;

a first auxiliary capacitor disposed between a gate electrode of the driving transistor and a reference voltage line; and a second auxiliary capacitor disposed between a gate electrode of the driving transistor and a high-potential voltage line.

* * * * *